US012740173B2

(12) United States Patent
Lee et al.

(10) Patent No.: US 12,740,173 B2
(45) Date of Patent: Sep. 15, 2026

(54) SEMICONDUCTOR DEVICE MANUFACTURING METHOD AND SEMICONDUCTOR DEVICE MANUFACTURED USING THE SAME

(71) Applicant: SAMSUNG ELECTRONICS CO., LTD., Suwon-si (KR)

(72) Inventors: Jun Kyoung Lee, Suwon-si (KR); Tae Seong Kim, Suwon-si (KR); Ho-Jin Lee, Suwon-si (KR); Dong-Chan Lim, Suwon-si (KR); Jae Won Hwang, Suwon-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 347 days.

(21) Appl. No.: 18/433,177

(22) Filed: Feb. 5, 2024

(65) Prior Publication Data

US 2024/0395745 A1 Nov. 28, 2024

(30) Foreign Application Priority Data

May 24, 2023 (KR) ........................ 10-2023-0066816

(51) Int. Cl.
*H10F 39/00* (2025.01)
*H10W 72/00* (2026.01)
(Continued)

(52) U.S. Cl.
CPC ....... *H10F 39/807* (2025.01); *H10F 39/8063* (2025.01); *H10F 39/809* (2025.01);
(Continued)

(58) Field of Classification Search
CPC ......... H10W 72/019; H10W 72/01938; H10W 72/01953; H10W 72/59; H10W 80/312;
(Continued)

(56) References Cited

U.S. PATENT DOCUMENTS 9,620,481 B2 4/2017 Edelstein et al.
9,728,521 B2 8/2017 Tsai et al.
(Continued)

FOREIGN PATENT DOCUMENTS

JP 2022-82187 A 6/2022
KR 10-2021-0055147 A 5/2021

*Primary Examiner* — Fazli Erdem
(74) *Attorney, Agent, or Firm* — Sughrue Mion, PLLC

(57) ABSTRACT

The present disclosure provides a semiconductor device manufacturing method that includes forming a lower chip and an upper chip, and bonding the lower chip and the upper chip to each other. The forming of the lower chip includes providing a lower substrate, sequentially forming a lower interlayer insulating film and a pre-lower adhesive film, etching portions of the pre-lower adhesive film and the lower interlayer insulating film to form a lower trench, forming, using a sputtering process, a first lower seed film and a second lower seed film. The forming of the upper chip includes providing an upper substrate, sequentially forming an upper interlayer insulating film and a pre-upper adhesive film, etching portions of the pre-upper adhesive film and the upper interlayer insulating film to form an upper trench, forming, using the sputtering process, a first upper seed film and a second upper seed film.

17 Claims, 20 Drawing Sheets

(51) Int. Cl.

| | |
|---|---|
| ***H10W 72/90*** | (2026.01) |
| ***H10W 80/00*** | (2026.01) |
| ***H10W 90/00*** | (2026.01) |

(52) U.S. Cl.

CPC ..... *H10F 39/811* (2025.01); *H10W 72/01938* (2026.01); *H10W 72/01953* (2026.01); *H10W 72/952* (2026.01); *H10W 80/312* (2026.01); *H10W 80/327* (2026.01); *H10W 90/792* (2026.01)

(58) Field of Classification Search

CPC . H10W 80/327; H10W 90/20; H10W 90/792; H10F 39/8063; H10F 39/809

See application file for complete search history.

(56) References Cited

U.S. PATENT DOCUMENTS

| | | | | |
|---|---|---|---|---|
| 9,941,243 | B2 | 4/2018 | Kim et al. | |
| 10,790,248 | B2 | 9/2020 | Chen et al. | |
| 2015/0108648 | A1 | 4/2015 | Tsumura et al. | |
| 2017/0358553 | A1* | 12/2017 | Kim | H10W 90/00 |
| 2021/0043673 | A1 | 2/2021 | Kwon et al. | |
| 2022/0406740 | A1* | 12/2022 | Kim | H10F 39/8053 |
| 2023/0361069 | A1* | 11/2023 | Ishikawa | H10W 72/019 |

* cited by examiner

SEMICONDUCTOR DEVICE MANUFACTURING METHOD AND SEMICONDUCTOR DEVICE MANUFACTURED USING THE SAME

CROSS-REFERENCE TO RELATED APPLICATIONS

This application claims priority under 35 U.S.C. § 119 to Korean Patent Application No. 10-2023-0066816, filed on May 24, 2023, in the Korean Intellectual Property Office, the disclosure of which is incorporated by reference herein in its entirety.

BACKGROUND

1. Field

The present disclosure relates generally to semiconductor devices, and more particularly, to a semiconductor device manufacturing method and a semiconductor device manufactured using the same.

2. Description of Related Art

As electronic products may reduce in size and/or may be miniaturized, the use of semiconductor devices in which an upper pad of an upper chip and a lower pad of a lower chip are bonded and electrically connected may increase. However, as the sizes of the lower pad of the lower chip and/or the upper pad of the upper chip may gradually decrease, misalignment of the pads during a bonding process may increase.

Therefore, there exists a need for further improvements in semiconductor device manufacturing technology, as the need for smaller pad sizes may be constrained by pad misalignment and/or reliability of related semiconductor device manufacturing methods. Improvements are presented herein.

SUMMARY

Aspects of the present disclosure provide for a method for manufacturing a semiconductor device having improved performance and reliability when compared to related semiconductor device manufacturing methods.

Aspects of the present disclosure provide for a semiconductor device having improved performance and reliability when compared to related semiconductor devices.

According to an aspect of the present disclosure, a semiconductor device manufacturing method is provided. The semiconductor device manufacturing method includes forming a lower chip and an upper chip, and bonding the lower chip and the upper chip to each other. The forming of the lower chip includes providing a lower substrate, sequentially forming, on the lower substrate, a lower interlayer insulating film and a pre-lower adhesive film, etching a first portion of the pre-lower adhesive film and a second portion of the lower interlayer insulating film to form a lower trench, forming, using a sputtering process, a first lower seed film in the lower trench, and forming, using the sputtering process, a second lower seed film on the first lower seed film. The forming of the upper chip includes providing an upper substrate, sequentially forming, on the upper substrate, an upper interlayer insulating film and a pre-upper adhesive film, etching a third portion of the pre-upper adhesive film and a fourth portion of the upper interlayer insulating film to form an upper trench, forming, using the sputtering process, a first upper seed film in the upper trench, and forming, using the sputtering process, a second upper seed film on the first upper seed film. The second lower seed film and the second upper seed film include manganese (Mn).

According to an aspect of the present disclosure, a semiconductor device manufacturing method is provided. The semiconductor device manufacturing method includes forming a lower pad pattern and an upper pad pattern, and bonding the lower pad pattern and the upper pad pattern to each other. The forming of the lower pad pattern includes providing a lower interlayer insulating film, etching a first portion of the lower interlayer insulating film to form a lower trench, forming, using a sputtering process, a first lower seed film in the lower trench, and forming, using the sputtering process, a second lower seed film on the first lower seed film. The forming of the upper pad pattern includes providing an upper interlayer insulating film, etching a second portion of the upper interlayer insulating film to form an upper trench, forming a pre-upper barrier film in the upper trench along one or more side walls and a bottom face of the upper trench, forming, using the sputtering process, a first upper seed film on the pre-upper barrier film, forming a pre-upper filling film on the first upper seed film, etching a third portion of the pre-upper filling film to form a recess, and forming, using the sputtering process, a second upper seed film in the recess. The second lower seed film and the second upper seed film include manganese (Mn).

According to an aspect of the present disclosure, a semiconductor device is provided. The semiconductor device includes a substrate including a first side and a second side opposite to each other, a plurality of unit pixels in the substrate and including a photoelectric conversion layer, a pixel isolation pattern in the substrate and configured to separate the plurality of unit pixels, a first inter-wiring insulating film on the first side of the substrate, a first pad pattern in the first inter-wiring insulating film, a first adhesive film extending along a lower face of the first inter-wiring insulating film, a second inter-wiring insulating film disposed on the lower face of the first inter-wiring insulating film, a second pad pattern disposed in the second inter-wiring insulating film, and in contact with the first pad pattern, a second adhesive film disposed along an upper face of the second inter-wiring insulating film, and in contact with the first adhesive film, and a microlens on the second side of the substrate. The first pad pattern includes a first portion in contact with the second pad pattern, and a second portion on the first portion. The second pad pattern includes a third portion in contact with the first pad pattern, and a fourth portion below the third portion. A first concentration of manganese (Mn) of the first portion of the first pad pattern is greater than a second concentration of manganese (Mn) of the second portion of the first pad pattern. A third concentration of manganese (Mn) of the third portion of the second pad pattern is greater than a fourth concentration of manganese (Mn) of the fourth portion of the second pad pattern.

Additional aspects may be set forth in part in the description which follows and, in part, may be apparent from the description, and/or may be learned by practice of the presented embodiments.

According to an aspect of the present disclosure, a semiconductor device manufacturing method is provided. The semiconductor device manufacturing method includes forming a lower chip and an upper chip, and bonding the lower chip and the upper chip to each other. The forming of the lower chip includes providing a lower substrate, sequentially forming, on the lower substrate, a lower interlayer insulating film and a pre-lower adhesive film, etching a first portion of the pre-lower adhesive film and a second portion of the lower interlayer insulating film to form a lower trench, forming, using a sputtering process, a first lower seed film in the lower trench, and forming, using the sputtering process, a second lower seed film on the first lower seed film. The forming of the upper chip includes providing an upper substrate, sequentially forming, on the upper substrate, an upper interlayer insulating film and a pre-upper adhesive film, etching a third portion of the pre-upper adhesive film and a fourth portion of the upper interlayer insulating film to form an upper trench, forming, using the sputtering process, a first upper seed film in the upper trench, and forming, using the sputtering process, a second upper seed film on the first upper seed film. The second lower seed film and the second upper seed film include manganese (Mn).

According to an aspect of the present disclosure, a semiconductor device manufacturing method is provided. The semiconductor device manufacturing method includes forming a lower pad pattern and an upper pad pattern, and bonding the lower pad pattern and the upper pad pattern to each other. The forming of the lower pad pattern includes providing a lower interlayer insulating film, etching a first portion of the lower interlayer insulating film to form a lower trench, forming, using a sputtering process, a first lower seed film in the lower trench, and forming, using the sputtering process, a second lower seed film on the first lower seed film. The forming of the upper pad pattern includes providing an upper interlayer insulating film, etching a second portion of the upper interlayer insulating film to form an upper trench, forming a pre-upper barrier film in the upper trench along one or more side walls and a bottom face of the upper trench, forming, using the sputtering process, a first upper seed film on the pre-upper barrier film, forming a pre-upper filling film on the first upper seed film, etching a third portion of the pre-upper filling film to form a recess, and forming, using the sputtering process, a second upper seed film in the recess. The second lower seed film and the second upper seed film include manganese (Mn).

According to an aspect of the present disclosure, a semiconductor device is provided. The semiconductor device includes a substrate including a first side and a second side opposite to each other, a plurality of unit pixels in the substrate and including a photoelectric conversion layer, a pixel isolation pattern in the substrate and configured to separate the plurality of unit pixels, a first inter-wiring insulating film on the first side of the substrate, a first pad pattern in the first inter-wiring insulating film, a first adhesive film extending along a lower face of the first inter-wiring insulating film, a second inter-wiring insulating film disposed on the lower face of the first inter-wiring insulating film, a second pad pattern disposed in the second inter-wiring insulating film, and in contact with the first pad pattern, a second adhesive film disposed along an upper face of the second inter-wiring insulating film, and in contact with the first adhesive film, and a microlens on the second side of the substrate. The first pad pattern includes a first portion in contact with the second pad pattern, and a second portion on the first portion. The second pad pattern includes a third portion in contact with the first pad pattern, and a fourth portion below the third portion. A first concentration of manganese (Mn) of the first portion of the first pad pattern is greater than a second concentration of manganese (Mn) of the second portion of the first pad pattern. A third concentration of manganese (Mn) of the third portion of the second pad pattern is greater than a fourth concentration of manganese (Mn) of the fourth portion of the second pad pattern.

Additional aspects may be set forth in part in the description which follows and, in part, may be apparent from the description, and/or may be learned by practice of the presented embodiments.

BRIEF DESCRIPTION OF THE DRAWINGS

The above and other aspects, features, and advantages of certain embodiments of the present disclosure may be more apparent from the following description taken in conjunction with the accompanying drawings, in which.

DETAILED DESCRIPTION

Figure 1:
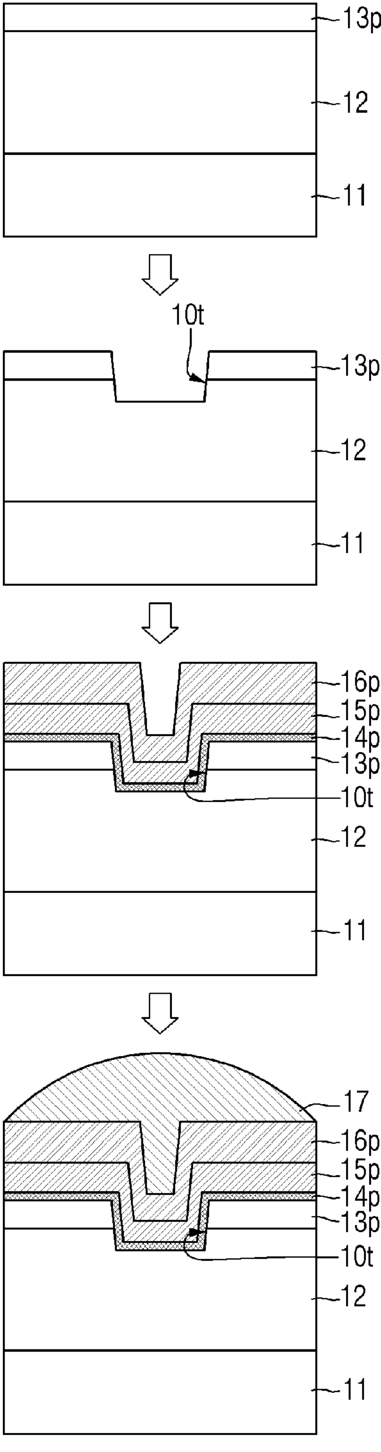
FIGS. 1 to 5 illustrate an exemplary method for manufacturing a semiconductor device, according to some embodiments.

FIGS. The following description with reference to the accompanying drawings is provided to assist in a comprehensive understanding of embodiments of the present disclosure defined by the claims and their equivalents. Various specific details are included to assist in understanding, but these details are considered to be exemplary only. Therefore, those of ordinary skill in the art may recognize that various changes and modifications of the embodiments described herein may be made without departing from the scope and spirit of the disclosure. In addition, descriptions of well-known functions and structures are omitted for clarity and conciseness.

With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as “A or B,” “at least one of A and B,” “at least one of A or B,” “A, B, or C,” “at least one of A, B, and C,” and “at least one of A, B, or C,” may include any one of, or all possible combinations of the items enumerated together in a corresponding one of the phrases. As used herein, such terms as “1st” and “2nd,” or “first” and “second” may be used to simply distinguish a corresponding component from another, and does not limit the components in other aspect (e.g., importance or order). It is to be understood that if an element (e.g., a first element) is referred to, with or without the term “operatively” or “communicatively”, as “coupled with,” “coupled to,” “connected with,” or “connected to” another element (e.g., a second element), it means that the element may be coupled with the other element directly (e.g., wired), wirelessly, or via a third element.

It is to be understood that when an element or layer is referred to as being “over,” “above,” “on,” “below,” “under,” “beneath,” “connected to” or “coupled to” another element or layer, it may be directly over, above, on, below, under, beneath, connected or coupled to the other element or layer or intervening elements or layers may be present. In contrast, when an element is referred to as being “directly over,” “directly above,” “directly on,” “directly below,” “directly under,” “directly beneath,” “directly connected to” or “directly coupled to” another element or layer, there are no intervening elements or layers present.

The terms “upper,” “middle”, “lower”, and the like may be replaced with terms, such as “first,” “second,” third” to be used to describe relative positions of elements. The terms “first,” “second,” third” may be used to describe various elements but the elements are not limited by the terms and a “first element” may be referred to as a “second element”. Alternatively or additionally, the terms “first”, “second”, “third”, and the like may be used to distinguish components from each other and do not limit the present disclosure. For example, the terms “first”, “second”, “third”, and the like may not necessarily involve an order or a numerical meaning of any form.

Reference throughout the present disclosure to “one embodiment,” “an embodiment,” “an example embodiment,” or similar language may indicate that a particular feature, structure, or characteristic described in connection with the indicated embodiment is included in at least one embodiment of the present solution. Thus, the phrases “in one embodiment”, “in an embodiment,” “in an example embodiment,” and similar language throughout this disclosure may, but do not necessarily, all refer to the same embodiment.

The embodiments herein may be described and illustrated in terms of blocks, as shown in the drawings, which carry out a described function or functions. These blocks, which may be referred to herein as units or modules or the like, or by names such as device, logic, circuit, counter, comparator, generator, converter, or the like, may be physically implemented by analog and/or digital circuits including one or more of a logic gate, an integrated circuit, a microprocessor, a microcontroller, a memory circuit, a passive electronic component, an active electronic component, an optical component, and the like, and may also be implemented by or driven by software and/or firmware (configured to perform the functions or operations described herein).

As used herein, each of the terms “$Al_2O_3$”, “CuMn”, “GaAs”, “GaSb”, “$HfO_2$”, “InAs”, “InP”, “InSb”, “$MoS_2$”, “$MoSe_2$”, “NbN”, “NiB”, “PbTe”, “SiCN”, “SiN”, “SiO”, “$SiO_xN_y$”, “TaN”, “TaO”, “TiN”, “TiSiN”, “VN”, “WCN”, “WN”, “$WS_2$”, “$WSe_2$”, “ZrN”, and the like may refer to a material made of elements included in each of the terms and is not a chemical formula representing a stoichiometric relationship.

Hereinafter, various embodiments of the present disclosure are described with reference to the accompanying drawings.

FIGS. 1 to 5 illustrate an exemplary method for manufacturing a semiconductor device, according to some embodiments. The method for manufacturing the semiconductor device, according to some embodiments, may include forming a lower chip, forming an upper chip, and bonding the lower chip and the upper chip to each other.

Figure 2:
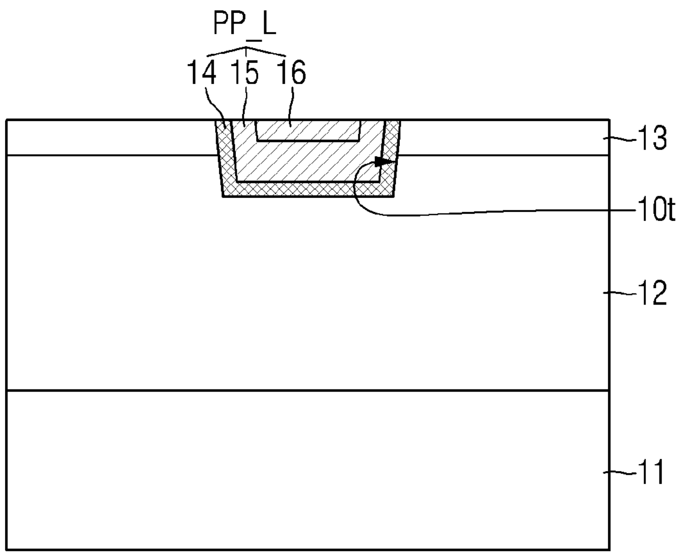
Figure 3:
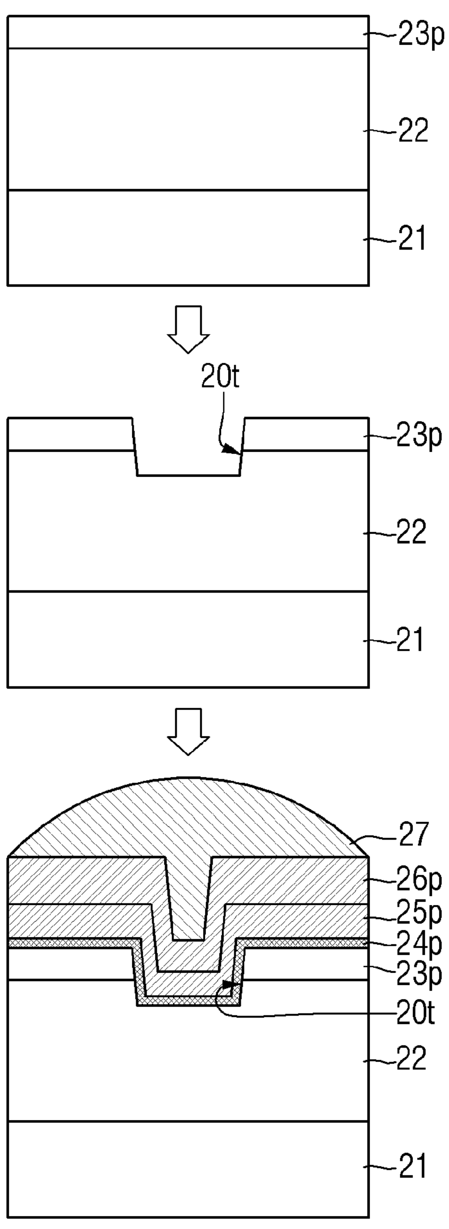
Figure 4:
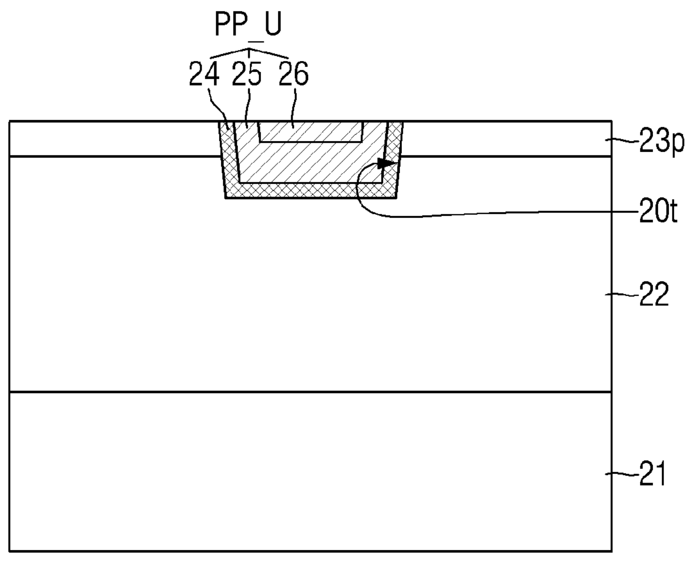
Figure 5:
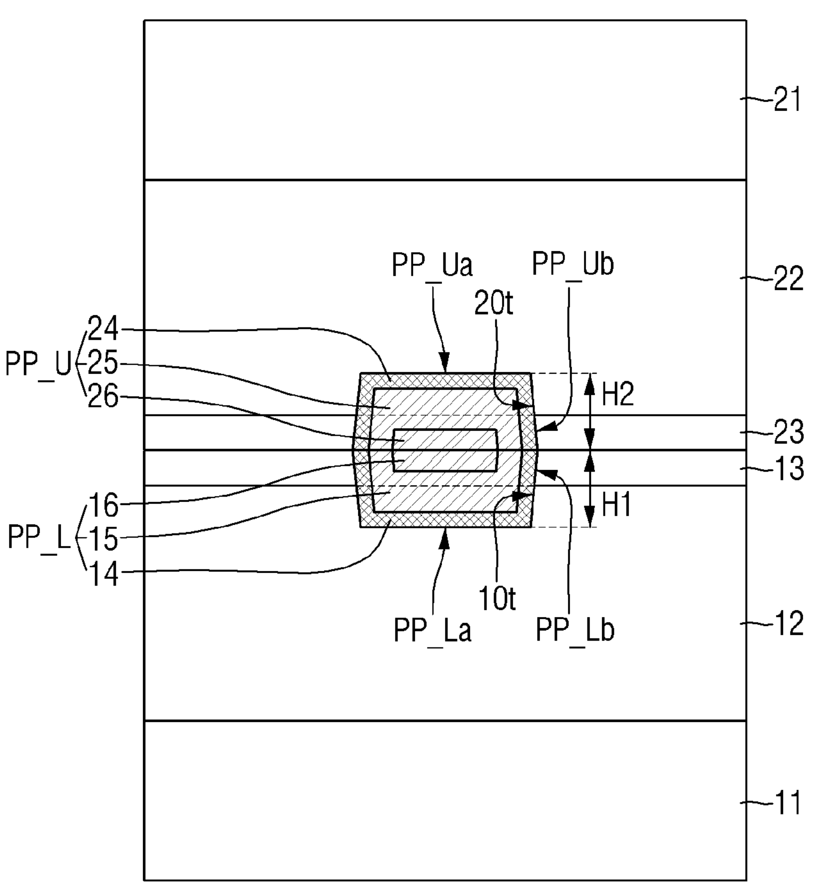

FIGS. 1 and 2 illustrate an exemplary process of forming the lower chip. FIGS. 3 and 4 illustrate an exemplary process of forming the upper chip. FIG. 5 illustrates a semiconductor device in which the lower chip and the upper chip are bonded.

Referring to FIG. 1, formation of the lower chip may include provision of a lower substrate 11.

The lower substrate 11 may be and/or may a silicon substrate and/or a silicon-on-insulator (SOI). Alternatively or additionally, the lower substrate 11 may include, but may not be limited to, silicon-germanium, silicon-germanium on insulator (SGOI), indium antimonide (InSb), lead telluride (PbTe), indium arsenide (InAs), indium phosphide (InP), gallium arsenide (GaAs), and gallium antimonide (GaSb).

A lower interlayer insulating film 12 may be formed on the lower substrate 11. The lower interlayer insulating film 12 may include, for example, at least one of silicon oxide (SiO), silicon nitride (SiN), silicon oxynitride ($SiO_xN_y$), and a low dielectric constant material. The low dielectric constant material may include, for example, but may not be limited to, fluorinated TetraEthylOrthoSilicate (FTEOS), Hydrogen SilsesQuioxane (HSQ), BisbenzoCycloButene (BCB), TetraMethylOrthoSilicate (TMOS), OctaMethyleyCloTetraSiloxane (OMCTS), HexaMethylDiSiloxane (HMDS), TriMethylSilyl borate (TMSB), DiAcetoxyDitertiaryButoSiloxane (DADBS), TriMethylSilil phosphate (TMSP), PolyTetraFluoroEthylene (PTFE), tonen silazen (TOSZ), fluoride silicate glass (FSG), polyimide nanofoams (such as polypropylene oxide), carbon doped silicon oxide (CDO), organo silicate glass (OSG), SiLK™, amorphous fluorinated carbon, silica aerogels, silica xerogels, mesoporous silica, and/or combinations thereof.

A pre-lower adhesive film **13*p* may be formed on the lower interlayer insulating film 12. The lower interlayer insulating film 12 may be provided between the pre-lower adhesive film 13*p* and the lower substrate 11. The pre-lower adhesive film 13*p* may be formed of an insulating material. For example, the pre-lower adhesive film 13*p*** may include, but may not be limited to, silicon carbonitride (SiCN).

In some embodiments, a lower trench **10*t* may be formed. For example, the lower trench 10*t* may be formed by partially etching the pre-lower adhesive film 13*p* and the lower interlayer insulating film 12. As an example, a bottom face of the lower trench 10*t* may be placed at a lower level than a bottom face of the pre-lower adhesive film 13*p*, with respect to the upper face of the lower substrate 11. That is, a vertical distance from the upper face of the lower substrate 11 to the bottom face of the lower trench 10*t* may be shorter than a vertical distance from the upper face of the lower substrate 11 to the bottom face of the pre-lower adhesive film 13*p***. However, the present disclosure may not be limited thereto.

In some embodiments, the pre-lower barrier film **14*p* may be subsequently formed. For example, the pre-lower barrier film 14*p* may be formed along the upper face of the pre-lower adhesive film 13*p*, the side walls of the lower trench 10*t*, and the bottom face of the lower trench 10*t*. The pre-lower barrier film 14*p*** may include, for example, at least one of tantalum (Ta), tantalum nitride (TaN), titanium (Ti), titanium nitride (TiN), titanium silicon nitride (TiSiN), ruthenium (Ru), cobalt (Co), nickel (Ni), nickel boron (NiB), tungsten (W), tungsten nitride (WN), tungsten carbonitride (WCN), zirconium (Zr), zirconium nitride (ZrN), vanadium (V), vanadium nitride (VN), niobium (Nb), niobium nitride (NbN), platinum (Pt), iridium (Ir), rhodium (Rh), and a two-dimensional (2D) material. In some embodiments, the 2D material may be and/or may include a metallic material and/or a semiconductor material. For example, the 2D material may be and/or may include a 2D allotrope and/or a 2D compound. Alternatively or additionally, the 2D material may include, but may not be limited to, at least one of graphene, molybdenum disulfide ($MoS_2$), molybdenum diselenide ($MoSe_2$), tungsten diselenide ($WSe_2$), and tungsten disulfide ($WS_2$). That is, the present disclosure may not be limited in this regard, and the 2D materials may include additional materials not listed above.

In some embodiments, a first lower seed film 15*p* may be formed on the pre-lower barrier film 14*p*. For example, the first lower seed film 15*p* may be formed using a sputtering process. Consequently, the size of crystal grains of the first lower seed film 15*p* may be smaller than the size of crystal grains of a film formed using another process, different from the sputtering process. For example, the size of the crystal grains of the first lower seed film 15*p* may be smaller than the size of the crystal grains of a lower sacrificial film 17, as described below.

The first lower seed film 15*p* may be formed non-conformally. For example, a thickness of the first lower seed film 15*p* formed along the side walls of the lower trench 10*t* and a thickness of the first lower seed film 15*p* formed along the bottom face of the lower trench 10*t* may differ from each other. However, the present disclosure may not be limited thereto. In some embodiments, the first lower seed film 15*p* may include a conductive material. For example, the first lower seed film 15*p* may include, but may not be limited to, copper (Cu).

In some embodiments, a second lower seed film 16*p* may be formed on the first lower seed film 15*p*. The first lower seed film 15*p* and the second lower seed film 16*p* may be in contact with each other. The second lower seed film 16*p* may be formed using a sputtering process. The second lower seed film 16*p* may be formed non-conformally. For example, a thickness of the second lower seed film 16*p* formed along the side wall of the lower trench 10*t* and a thickness of the second lower seed film 16*p* formed along the bottom face of the lower trench 10*t* may differ from each other. However, the present disclosure may not be limited thereto. The second lower seed film 16*p* may include a conductive material. For example, the second lower seed film 16*p* may include, but may not be limited to, manganese (Mn). As another example, the second lower seed film 16*p* may include, but may not be limited to, copper manganese (CuMn).

In some embodiments, a lower sacrificial film 17 may be formed on the second lower seed film 16*p*. The lower sacrificial film 17 may be formed by an electroplating process. As a result of forming the lower sacrificial film 17 using the electroplating process, the upper face of the lower sacrificial film 17 may be a convex curved face. Alternatively or additionally, since the lower sacrificial film 17 may be formed using the electroplating process, the size of the crystal grain of the lower sacrificial film 17 may be smaller than the size of the crystal grain of the first lower seed film 15*p*. The lower sacrificial film 17, according to some embodiments, may include, but may not be limited to, copper (Cu).

In some embodiments, the lower sacrificial film 17 may be formed, and/or a heat treatment process may be performed. For example, the heat treatment process may be performed at temperatures that may be higher than 100° C. and/or lower than 200° C. As a result of performing the heat treatment process at temperatures lower than 200° C., the manganese (Mn) contained in the second lower seed film 16*p* may not diffuse into the first lower seed film 15*p* and/or the lower sacrificial film 17.

Referring to FIG. 2, a lower pad pattern PP_L may be formed. The lower pad pattern PP_L may be provided inside the lower trench 10*t*. The lower pad pattern PP_L may be formed by etching the lower sacrificial film 17, the second lower seed film 16*p*, the first lower seed film 15*p*, the pre-lower barrier film 14*p*, and the pre-lower adhesive film 13*p*. The lower pad pattern PP_L may be formed using a chemical/mechanical polishing (CMP) process.

The lower adhesive film 13 may be formed by etching the pre-lower adhesive film 13*p*. A thickness of the pre-lower adhesive film 13*p* in a vertical direction may be greater than a thickness of the lower adhesive film 13 in the vertical direction. That is, the vertical direction may be a thickness direction of the lower substrate 11. Alternatively, the vertical direction may be a direction perpendicular to the upper side of the lower substrate 11. The lower adhesive film 13 may include, for example, but may not be limited to, silicon carbonitride (SiCN).

In some embodiments, the lower pad pattern PP_L may include a lower barrier film 14, a first lower filling film 15, and a second lower filling film 16.

The lower barrier film 14 may be formed by etching the pre-lower barrier film 14*p*. The lower barrier film 14 may be placed along one or more side walls and a bottom face of the lower trench 10*t*. The lower barrier film 14 may include, for example, at least one of tantalum (Ta), tantalum nitride (TaN), titanium (Ti), titanium nitride (TiN), titanium silicon nitride (TiSiN), ruthenium (Ru), cobalt (Co), nickel (Ni), nickel boron (NiB), tungsten (W), tungsten nitride (WN), tungsten carbonitride (WCN), zirconium (Zr), zirconium nitride (ZrN), vanadium (V), vanadium nitride (VN), niobium (Nb), niobium nitride (NbN), platinum (Pt), iridium (Ir), rhodium (Rh), and two-dimensional (2D) material.

The first lower filling film 15 may be formed by etching the first lower seed film 15*p*. The first lower filling film 15 may be placed on the lower barrier film 14. The first lower filling film 15 may partially fill the lower trench 10*t*. The first lower filling film 15 may include, but may not be limited to, copper (Cu).

The second lower filling film 16 may be formed by etching the second lower seed film 16*p*. The second lower filling film 16 may be placed on the first lower filling film 15. The second lower filling film 16 may at least partially fill the lower trench 10*t* that may remain after the lower barrier film 14 and the first lower filling film 15 are filled. The second lower filling film 16 may include, but may not be limited to, copper manganese (CuMn).

That is, the lower pad pattern PP_L may contain manganese (Mn). In some embodiments, a concentration of manganese (Mn) in the lower pad pattern PP_L may gradually decrease from the upper face to the lower face of the lower pad pattern PP_L. However, the present disclosure may not be limited thereto.

In some embodiments, the upper face of the lower pad pattern PP_L and the upper face of the lower adhesive film 13 may be coplanar with each other.

Referring to FIG. 3, formation of the upper chip may include provision of the upper substrate 21. In an embodiment, formation of the lower chip and formation of the upper chip may be substantially similar and/or the same.

The upper substrate 21 may be and/or may include a silicon substrate and/or a silicon-on-insulator (SOI). Alternatively or additionally, the upper substrate 21 may include, but may not be limited to, silicon-germanium (SiGe), silicon germanium on insulator (SGOI), indium antimonide (InSb), lead telluride (PbTe), indium arsenide (InAs), indium phosphide (InP), gallium arsenide (GaAs), and gallium antimonide (GaSb).

An upper interlayer insulating film 22 may be formed on the upper substrate 21. The upper interlayer insulating film 22 may include, for example, at least one of silicon oxide (SiO), silicon nitride (SiN), silicon oxynitride ($SiO_xN_y$), and a low dielectric constant material. The low dielectric constant material may include, for example, but may not be limited to, fluorinated TetraEthylOrthoSilicate (FTEOS), Hydrogen SilsesQuioxane (HSQ), BisbenzoCycloButene (BCB), TetraMethylOrthoSilicate (TMOS), OctaMethyleyCloTetraSiloxane (OMCTS), HexaMethylDiSiloxane (HMDS), TriMethylSilyl borate (TMSB), DiAcetoxyDitertiaryButoSiloxane (DADBS), TriMethylSilil phosphate (TMSP), PolyTetraFluoroEthylene (PTFE), tonen silazen (TOSZ), fluoride silicate glass (FSG), polyimide nanofoams (such as polypropylene oxide), carbon doped silicon oxide (CDO), organo silicate glass (OSG), SiLK™, amorphous fluorinated carbon, silica aerogels, silica xerogels, mesoporous silica, and/or combinations thereof.

A pre-upper adhesive film 23*p* may be formed on the upper interlayer insulating film 22. The upper interlayer insulating film 22 may be provided between the pre-upper adhesive film 23*p* and the upper substrate 21. The pre-upper adhesive film 23*p* may be formed of an insulating material. For example, the pre-upper adhesive film 23*p* may include, but may not be limited to, silicon carbonitride (SiCN).

In an embodiment, an upper trench 20*t* may be formed. The upper trench 20*t* may be formed by partially etching the pre-upper adhesive film 23*p* and the upper interlayer insulating film 22. For example, the bottom face of the upper trench 20*t* may be placed at a level lower than the bottom face of the pre-upper adhesive film 23*p*, with respect to the upper side of the upper substrate 21. That is, the vertical distance from the upper side of the upper substrate 21 to the bottom face of the upper trench 20*t* may be shorter than the vertical distance from the upper side of the upper substrate 21 to the bottom face of the pre-upper adhesive film 23*p*. However, the present disclosure may not be limited thereto.

In some embodiments, a pre-upper barrier film 24*p*, a first upper seed film 25*p*, a second upper seed film 26*p*, and an upper sacrificial film 27 may be sequentially formed.

For example, the pre-upper barrier film 24*p* may be formed. The pre-upper barrier film 24*p* may be formed along the upper face of the pre-upper adhesive film 23*p*, the side walls of the upper trench 20*t*, and the bottom face of the upper trench 20*t*. The pre-upper barrier film 24*p* may include a substantially similar and/or the same material as the pre-lower barrier film 14*p*.

The first upper seed film 25*p* may be formed on the pre-upper barrier film 24*p*. The first upper seed film 25*p* may be formed using a sputtering process. As a result, the size of the crystal grains of the first upper seed film 25*p* may be smaller than those of materials formed using other processes. For example, the size of the crystal grains of the first upper seed film 25*p* may be smaller than the size of the crystal grains of an upper sacrificial film 27, as described below.

In some embodiments, first upper seed film 25*p* may be formed non-conformally. For example, the thickness of the first upper seed film 25*p* formed along the side walls of the upper trench 20*t* and the thickness of the first upper seed film 25*p* formed along the bottom face of the upper trench 20*t* may be different from each other. However, the present disclosure may not be limited thereto. In some embodiments, the first upper seed film 25*p* may include a conductive material. For example, the first upper seed film 25*p* may include, but may not be limited to, copper (Cu).

A second upper seed film 26*p* may be formed on the first upper seed film 25*p*. The first upper seed film 25*p* and the second upper seed film 26*p* may be in contact with each other. The second upper seed film 26*p* may be formed using a sputtering process. In some embodiments, the second upper seed film 26*p* may be formed non-conformally. For example, the thickness of the second upper seed film 26*p* formed along the side walls of the upper trench 20*t* and the thickness of the second upper seed film 26*p* formed along the bottom face of the upper trench 20*t* may be different from each other. However, the present disclosure may not be limited thereto. In some embodiments, the second upper seed film 26*p* may include a conductive material. For example, the second upper seed film 26*p* may include, but may not be limited to, manganese (Mn). As another example, the second upper seed film 26*p* may include, but may not be limited to, copper manganese (CuMn).

The upper sacrificial film 27 may be formed on the second upper seed film 26*p*. The upper sacrificial film 27 may be formed using the electroplating process. As a result of the upper sacrificial film 27 being formed using the electroplating process, the upper face of the upper sacrificial film 27 may be a convex curved face. Alternatively or additionally, since the upper sacrificial film 27 may be formed using the electroplating process, the size of the crystal grains of the upper sacrificial film 27 may be smaller than the size of the crystal grains of the first upper seed film 25*p*. In some embodiments, the upper sacrificial film 27 may include, but may not be limited to, copper (Cu).

In some embodiments, the upper sacrificial film 27 may be formed and/or the heat treatment process may be performed. The heat treatment process may be performed at temperatures that may be higher than 100° C. and/or lower than 200° C. As a result of performing the heat treatment process at a temperature less than 200° C., manganese (Mn) contained in the second upper seed film 26*p* may not diffuse.

Referring to FIG. 4, an upper pad pattern PP_U may be formed. In some embodiments, the upper pad pattern PP_U may be provided inside the upper trench 20*t*. The upper pad pattern PP_U may be formed by etching the upper sacrificial film 27, the second upper seed film 26*p*, the first upper seed film 25*p*, the pre-upper barrier film 24*p*, and the pre-upper adhesive film 23*p*. The upper pad pattern PP_U may be formed using a CMP process.

The upper adhesive film 23 may be formed by etching the pre-upper adhesive film 23*p*. The thickness of the pre-upper adhesive film 23*p* in the vertical direction may be greater than the thickness of the upper adhesive film 23 in the vertical direction. The vertical direction may refer to the thickness direction of the upper substrate 21. Alternatively, the vertical direction may be a direction perpendicular to the upper side of the upper substrate 21. The upper adhesive film 23 may include, for example, but may not be limited to, silicon carbonitride (SiCN).

In some embodiments, the upper pad pattern PP_U may include an upper barrier film 24, a first upper filling film 25 and a second upper filling film 26.

The upper barrier film 24 may be formed by etching the pre-upper barrier film 24*p*. The upper barrier film 24 may be placed along the side walls and bottom face of the upper trench 20*t*. The upper barrier film 24 may include, for example, at least one of tantalum (Ta), tantalum nitride (TaN), titanium (Ti), titanium nitride (TiN), titanium silicon nitride (TiSiN), ruthenium (Ru), cobalt (Co), nickel (Ni), nickel boron (NiB), tungsten (W), tungsten nitride (WN), tungsten carbonitride (WCN), zirconium (Zr), zirconium nitride (ZrN), vanadium (V), vanadium nitride (VN), niobium (Nb), niobium nitride (NbN), platinum (Pt), iridium (Ir), rhodium (Rh), and two-dimensional (2D) material.

The first upper filling film 25 may be formed by etching the first upper seed film 25*p*. The first upper filling film 25 may be placed on the upper barrier film 24. The first upper filling film 25 may partially fill the upper trench 20*t*. The first upper filling film 25 may include, but may not be limited to, copper (Cu).

The second upper filling film 26 may be formed by etching the second upper seed film 26*p*. The second upper filling film 26 may be placed on the first upper filling film 25. The second upper filling film 26 may at least partially fill the upper trench 20*t* that may remain after the upper barrier film 24 and the first upper filling film 25 are filled. The second upper filling film 26 may include, but may not be limited to, copper manganese (CuMn). That is, the upper pad pattern PP_U may include manganese (Mn). In some embodiments, the concentration of manganese (Mn) in the upper pad pattern PP_U may gradually decrease from the upper face to the lower face of the upper pad pattern PP_U. However, the present disclosure may not be limited thereto.

In some embodiments, the upper face of the upper pad pattern PP_U and the upper face of the upper adhesive film 23 may be coplanar with each other.

Referring to FIG. 5, the lower chip and the upper chip may be bonded together. For example, the lower adhesive film 13 and the upper adhesive film 23 may be bonded together. As another example, the lower pad pattern PP_L and the upper pad pattern PP_U may be bonded together.

In some embodiments, bonding energy of CuMn—CuMn may be greater than bonding energy of Cu—Cu. According to some embodiments, manganese (Mn) may be placed on a boundary face in which the lower pad pattern PP_L and the upper pad pattern PP_U are bonded to each other. Therefore, the lower pad pattern PP_L and the upper pad pattern PP_U may be relatively more stably bonded when bonded together.

In some embodiments, the lower pad pattern PP_L may include a first portion PP_La and a second portion PP_Lb. The second portion PP_Lb of the lower pad pattern PP_L may be placed on the first portion PP_La of the lower pad pattern PP_L. The first portion PP_La of the lower pad pattern PP_L may be placed in the lower interlayer insulating film 12. The second portion PP_Lb of the lower pad pattern PP_L may be placed in the lower adhesive film 13. The concentration of manganese (Mn) in the second portion PP_Lb of the lower pad pattern PP_L may be greater than the concentration of manganese (Mn) in the first portion PP_La of the lower pad pattern PP_L.

The upper pad pattern PP_U may include a first portion PP_Ua and a second portion PP_Ub. The second portion PP_Ub of the upper pad pattern PP_U may be placed below the first portion PP_Ua of the upper pad pattern PP_U. The first portion PP_Ua of the upper pad pattern PP_U may be placed in the upper interlayer insulating film 22. The second portion PP_Ub of the upper pad pattern PP_U may be placed in the upper adhesive film 23. The concentration of manganese (Mn) in the second portion PP_Ub of the upper pad pattern PP_U may be greater than the concentration of manganese (Mn) in the first portion PP_Ua of the upper pad pattern PP_U.

In some embodiments, a first height H1 of the lower pad pattern PP_L in the vertical direction may be substantially similar and/or the same as a second height H2 of the upper pad pattern PP_U in the vertical direction. However, the present disclosure may not be limited thereto.

Figure 6:
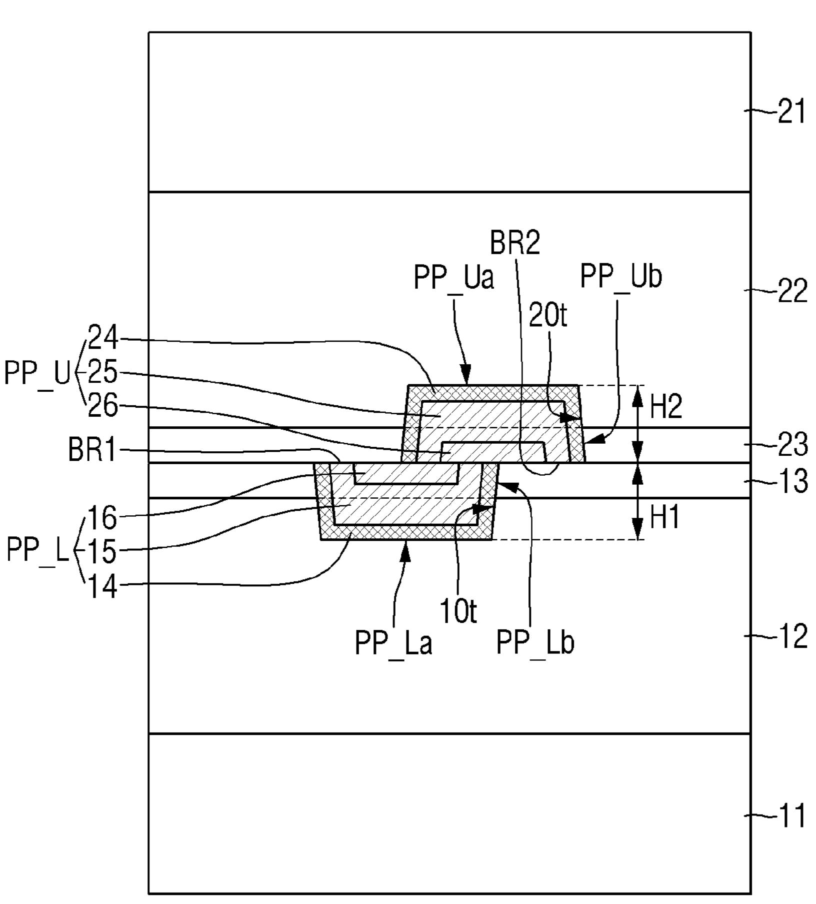
FIGS. 6 and 7 depict an exemplary semiconductor device, according to some embodiments.
Figure 7:
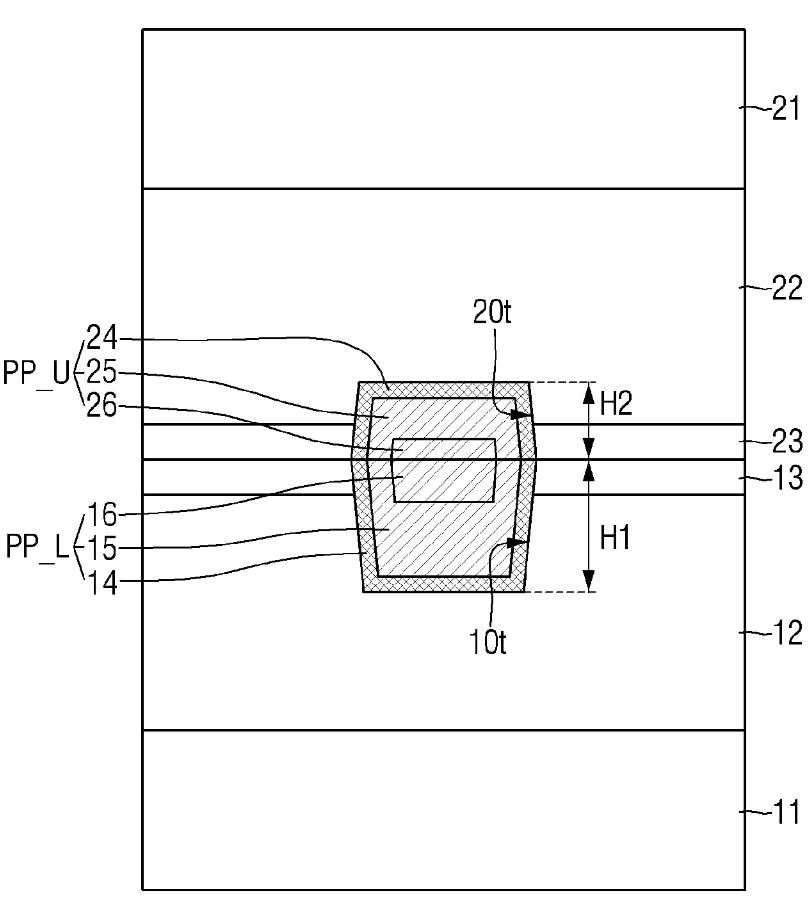

Hereinafter, a semiconductor device, according to some embodiments, is described with reference to FIGS. 6 and 7. For convenience of explanation, repeated contents of the features described with reference to FIGS. 1 to 5 may be explained briefly and/or omitted. FIGS. 6 and 7 are diagrams illustrating a semiconductor device, according to some embodiments.

Referring to FIG. 6, the lower pad pattern PP_L and the upper pad pattern PP_U may be misaligned.

A part of the lower pad pattern PP_L may be in contact with the upper adhesive film 23. A part of the upper pad pattern PP_U may be in contact with the lower adhesive film 13. As the semiconductor device, according to some embodiments, is miniaturized and/or decreased in size, the sizes of the lower pad pattern PP_L and the upper pad pattern PP_U may decrease. Accordingly, the lower pad pattern PP_L and the upper pad pattern PP_U may be more likely to be misaligned when bonded to each other.

In some embodiments, the semiconductor device may include a first boundary face BR1 and a second boundary face BR2. The first boundary face BR1 may be and/or may include a boundary face between the lower pad pattern PP_L and the upper adhesive film 23. The second boundary face BR2 may be and/or may include a boundary face between the upper pad pattern PP_U and the lower adhesive film 13.

The lower pad pattern PP_L and the upper pad pattern PP_U may each contain manganese (Mn). That is, manganese (Mn) may be placed at the boundary between the lower pad pattern PP_L and the upper adhesive film 23. For example, manganese (Mn) may be placed on the first boundary face BR1. Alternatively or additionally, manganese (Mn) may be placed at the boundary between the upper pad pattern PP_U and the lower adhesive film 13. As another example, manganese (Mn) may be placed on the second boundary face BR2.

When manganese (Mn) is placed at the boundary between the lower pad pattern PP_L and the upper adhesive film 23, a binding force between the lower pad pattern PP_L and the upper adhesive film 23 may be strengthened, compared to a case where manganese (Mn) is not placed at the boundary between the lower pad pattern PP_L and the upper adhesive film 23. Similarly, when manganese (Mn) is placed at the boundary between the upper pad pattern PP_U and the lower adhesive film 13, the binding force between the upper pad pattern PP_U and the lower adhesive film 13 may be strengthened, compared to a case where manganese (Mn) is not placed at the boundary between the upper pad pattern PP_U and the lower adhesive film 13U. Accordingly, a semiconductor device with improved reliability may be manufactured, when compared to related semiconductor devices.

Referring to FIG. 7, the first height H1 of the lower pad pattern PP_L in the vertical direction may be different from the second height H2 of the upper pad pattern PP_U in the vertical direction. For example, the first height H1 may be greater than the second height H2. However, the present disclosure may not be limited thereto.

Hereinafter, a method for manufacturing a semiconductor device according to some embodiments is described with reference to FIGS. 8 to 13. FIGS. 8 to 13 illustrate an exemplary method for manufacturing the semiconductor device according to some embodiments. For convenience of explanation, the description of FIGS. 8 to 13 may focus on features that may be different from features that may have been discussed with reference to FIGS. 1 to 5.

Referring to FIGS. 8 to 13, a method for manufacturing the semiconductor device may include forming a lower chip, forming an upper chip, and bonding the lower chip and the upper chip to each other. The forming of the lower chip may include forming the lower pad pattern, the forming of the upper chip may include forming the upper pad pattern, and the bonding of the lower chip and the upper chip to each other may include bonding the lower pad pattern and the upper pad pattern to each other.

The forming of the lower chip and the forming of the lower pad pattern may be substantially similar and/or the same as described with reference to FIGS. 1 and 2.

Figure 8:
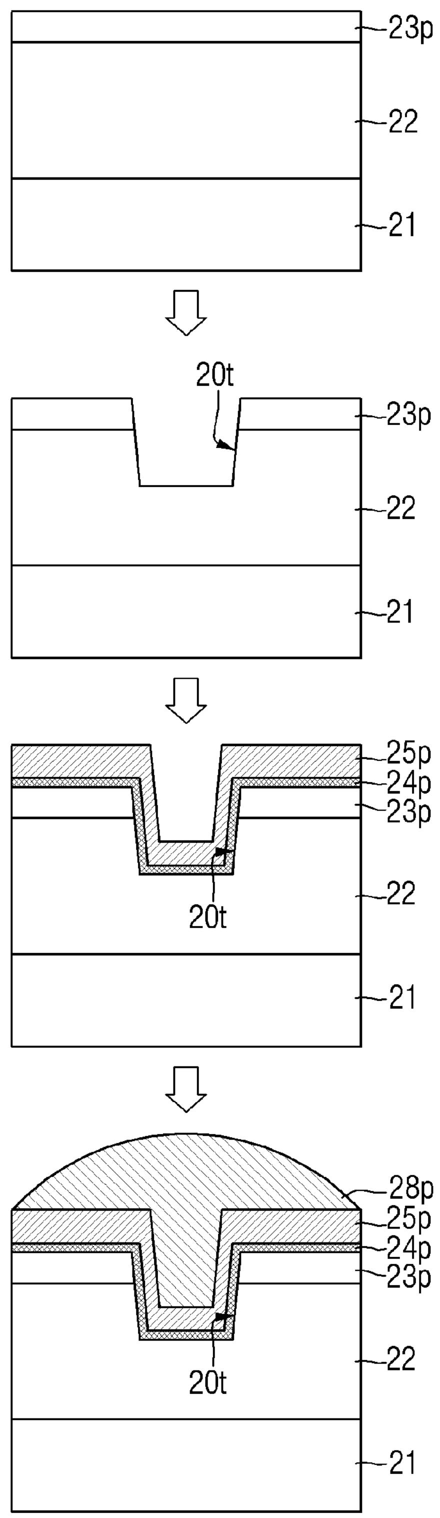
FIGS. 8 to 13 illustrate an exemplary method for manufacturing the semiconductor device, according to some embodiments.

Referring to FIG. 8, the forming of the upper chip may include providing the upper substrate 21. The upper interlayer insulating film 22 and the pre-upper adhesive film 23*p* may be sequentially formed on the substrate 21.

In some embodiments, the upper trench 20*t* may be formed. For example, the upper trench 20*t* may be formed by partially etching the pre-upper adhesive film 23*p* and the upper interlayer insulating film 22. The upper trench 20*t* may be formed to be deeper than the lower trench 10*t*. For example, the depth of the lower trench 10*t* in the vertical direction may be smaller than the depth of the upper trench 20*t* in the vertical direction.

In some embodiments, the pre-upper barrier film 24*p* may be formed. For example, the pre-upper barrier film 24*p* may be formed along the upper face of the pre-upper adhesive film 23*p*, the side walls of the upper trench 20*t*, and the bottom face of the upper trench 20*t*.

In some embodiments, the first upper seed film 25*p* may be formed on the pre-upper barrier film 24*p*. For example, the first upper seed film 25*p* may be formed using the sputtering process. As a result, the size of the crystal grains of the first upper seed film 25*p* may be smaller than those of materials formed using other processes. For example, the size of the crystal grains of the first upper seed film 25*p* may be smaller than size of crystal grains of a pre-third upper filling film 28*p*, as described below. The first upper seed film 25*p* may be formed non-conformally. In some embodiments, the first upper seed film 25*p* may include a conductive material. For example, the first upper seed film 25*p* may include, but may not be limited to, copper (Cu).

In some embodiments, the pre-third upper filling film 28*p* may be formed. For example, the pre-third upper filling film 28*p* may be formed on the first upper seed film 25*p*. The pre-third upper filling film 28*p* may be formed using the electroplating process. Since the pre-third upper filling film 28*p* may be formed using the electroplating process, the upper face of the pre-third upper filling film 28*p* may be a convex curved face. Alternatively or additionally, since the pre-third upper filling film 28*p* may be formed using the electroplating process, the size of the crystal grains of the pre-third upper filling film 28*p* may be smaller than the size of the crystal grains of the first upper seed film 25*p*. In some embodiments, the pre-third upper filling film 28*p* may include a conductive material. For example, the pre-third upper filling film 28*p* may include, but may not be limited to, copper (Cu).

After forming the pre-third upper filling film 28*p*, a heat treatment process may be performed. The heat treatment process may be performed at temperatures that may be higher than 100° C. and/or lower than 200° C.

Figure 9:
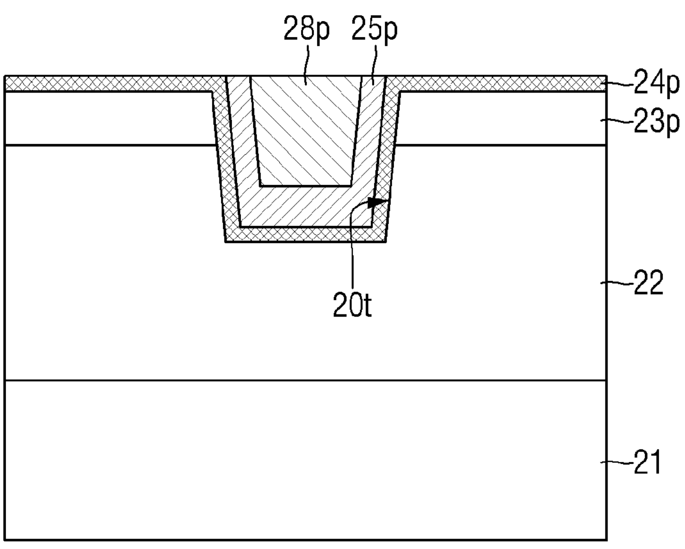

Referring to FIG. 9, a part of the pre-third upper filling film 28*p* and a part of the first upper seed film 25*p* may be etched, using a CMP process. A part of the pre-third upper filling film 28*p* and a part of the first upper seed film 25*p* may be etched to expose the pre-upper barrier film 24*p*.

Figure 10:
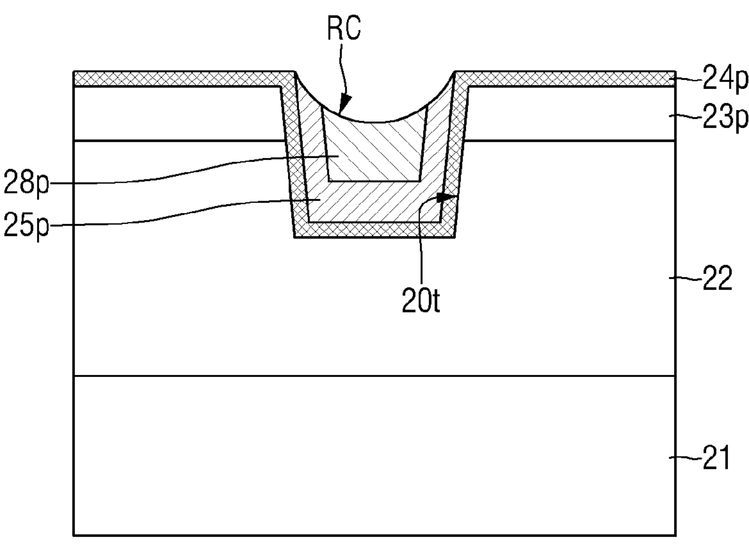

Referring to FIG. 10, a recess RC may be formed by selectively etching a part of the pre-third upper filling film 28*p* and a part of the first upper seed film 25*p*. The pre-third upper filling film 28*p* may be formed of a material having an etching selectivity with the pre-upper barrier film 24*p*. Similarly, the first upper seed film 25*p* may be formed of a material having an etching selectivity with the pre-upper barrier film 24*p*. Therefore, the pre-upper barrier film 24*p* may not be etched, and only the pre-third upper filling film 28*p* and the first upper seed film 25*p* may be selectively etched.

Figure 11:
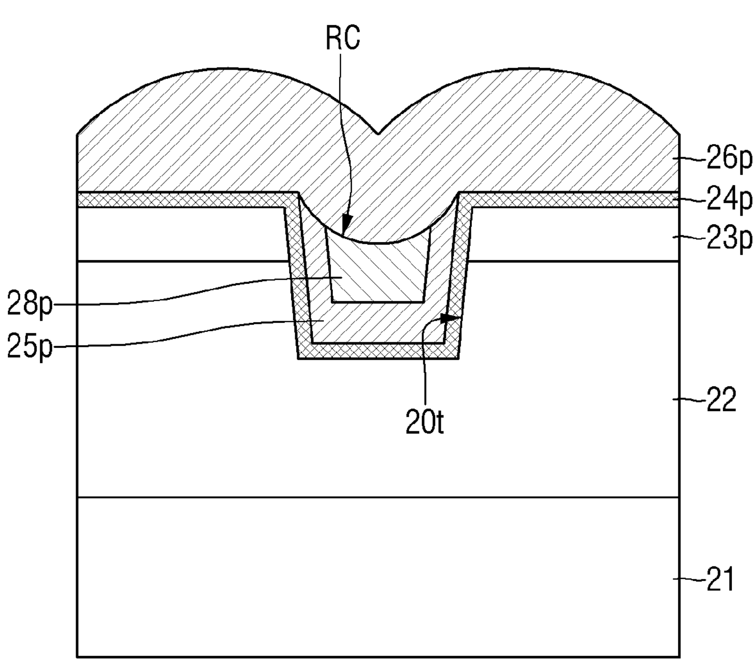

Referring to FIG. 11, a second upper seed film 26*p* may be formed. The second upper seed film 26*p* may at least partially fill the recess RC, and may be formed on the pre-upper barrier film 24*p*. The second upper seed film 26*p* may be formed using the sputtering process. The second upper seed film 26*p* may include a conductive material. The second upper seed film 26*p* may contain, but may not be limited to, manganese (Mn). For example, the second upper seed film 26*p* may include copper manganese (CuMn).

Figure 12:
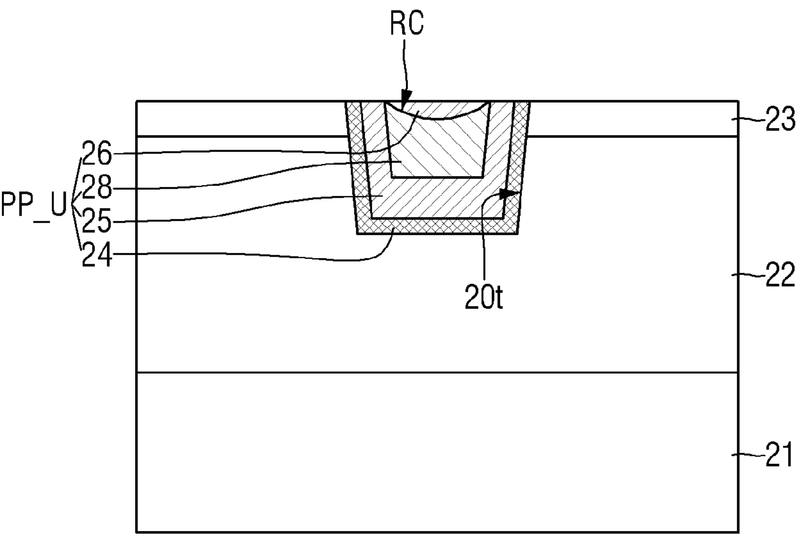

Referring to FIG. 12, the upper pad pattern PP_U may be formed. The upper pad pattern PP_U may be provided in the upper trench 20*t*. The upper pad pattern PP_U may be formed by etching the second upper seed film 26*p*, the pre-third upper filling film 28*p*, the pre-upper barrier film 24*p*, the first upper seed film 25*p*, and the pre-upper adhesive film 23*p*. The upper pad pattern PP_U may be formed using the CMP process.

The upper pad pattern PP_U may include an upper barrier film 24, a first upper filling film 25, a second upper filling film 26, and a third upper filling film 28.

The upper barrier film 24 may be placed along one or more side walls and a bottom face of the upper trench 20*t*. The first upper filling film 25 may be placed on the upper barrier film 24. The third upper filling film 28 may be placed on the first upper filling film 25. The second upper filling film 26 may be placed on the third upper filling film 28.

As described above, the first upper filling film 25 and the second upper filling film 26 may be formed using the sputtering process, and the third upper filling film 28 may be formed using the electroplating process. Consequently, the size of the crystal grains of the first upper filling film 25 and the second upper filling film 26 may be smaller than the size of the crystal grains of the third upper filling film 28.

Figure 13:
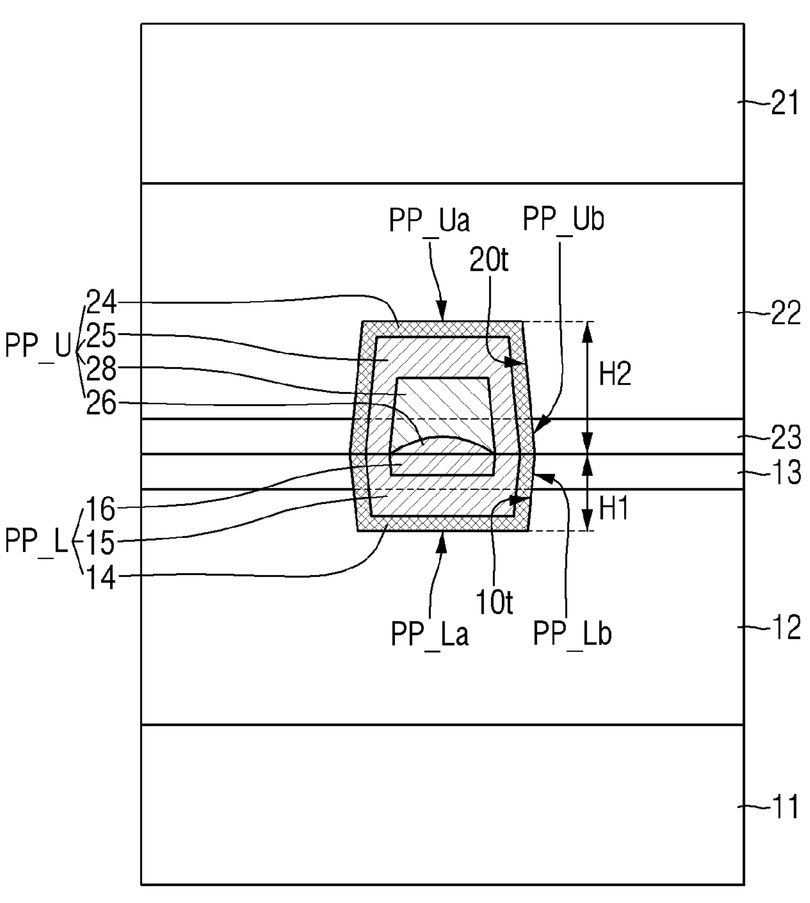

Referring to FIG. 13, the lower chip and the upper chip may be bonded together. For example, the lower adhesive film 13 and the upper adhesive film 23 may be bonded together, and the lower pad pattern PP_L and the upper pad pattern PP_U may be bonded together.

In some embodiments, the bonding energy of CuMn—CuMn may be greater than the bonding energy of Cu—Cu. According to some embodiments, manganese (Mn) may be placed on the boundary face in which the lower pad pattern PP_L and the upper pad pattern PP_U may be bonded to each other. Therefore, the lower pad pattern PP_L and the upper pad pattern PP_U may be relatively more stably bonded when bonded together.

In some embodiments, the thickness in the vertical direction of the second lower filling film 16 of the lower pad pattern PP_L may be greater than the thickness in the vertical direction of the second upper filling film 26 of the upper pad pattern PP_U.

In some embodiments, the first height H1 of the lower pad pattern PP_L in the vertical direction may be smaller than the second height H2 of the upper pad pattern PP_U in the vertical direction.

Figure 14:
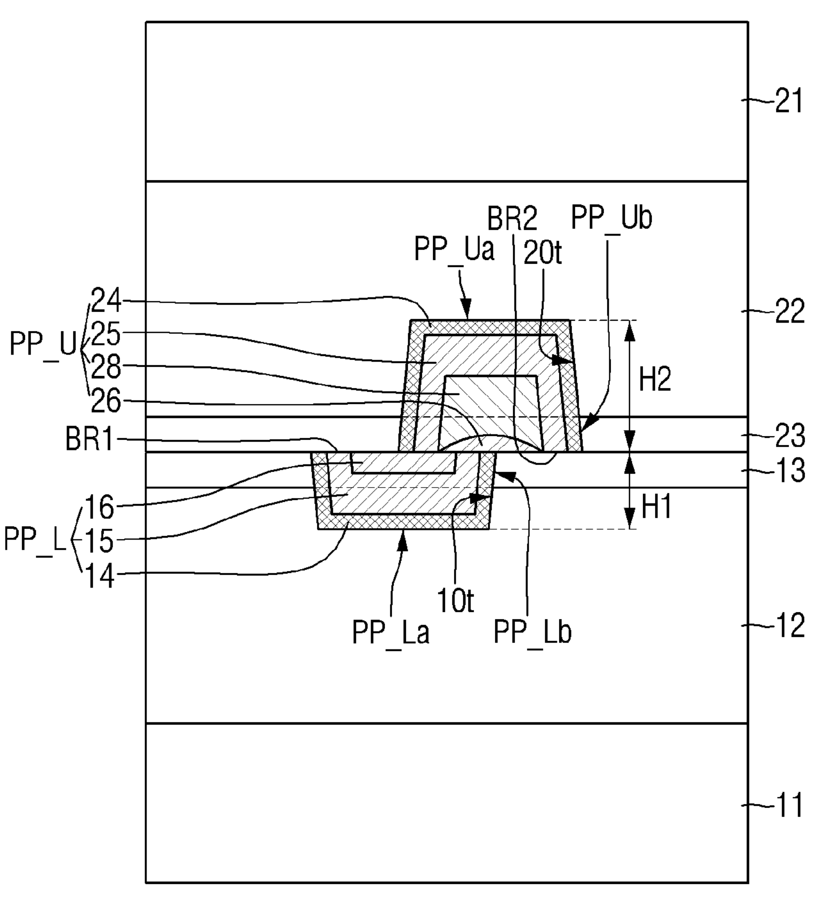
FIG. 14 is a diagram depicting a semiconductor device, according to some embodiments.

FIG. 14 is a diagram depicting a semiconductor device, according to some embodiments.

Referring to FIG. 14, the lower pad pattern PP_L and the upper pad pattern PP_U may be misaligned. That is, a part of the lower pad pattern PP_L may be in contact with the upper adhesive film 23, and/or a part of the upper pad pattern PP_U may be in contact with the lower adhesive film 13. As semiconductor devices are miniaturized and/or reduced in size, the sizes of the lower pad pattern PP_L and the upper pad pattern PP_U may decrease. Accordingly, the lower pad pattern PP_L and the upper pad pattern PP_U may be misaligned when bonded to each other. That is, a part of the third upper filling film 28 of the upper pad pattern PP_U may be in contact with the lower adhesive film 13.

The lower pad pattern PP_L and the upper pad pattern PP_U may each contain manganese (Mn). That is, manganese (Mn) may be placed at the boundary between the lower pad pattern PP_L and the upper adhesive film 23. Manganese (Mn) may be placed on the first boundary face BR1. Alternatively or additionally, manganese (Mn) may be placed at the boundary between the upper pad pattern PP_U and the lower adhesive film 13. Manganese (Mn) may be placed on the second boundary face BR2.

When manganese (Mn) is placed at the boundary between the lower pad pattern PP_L and the upper adhesive film 23, the binding force between the lower pad pattern PP_L and the upper adhesive film 23 may be strengthened, as compared to a case where manganese (Mn) is not placed at the boundary between the lower pad pattern PP_L and the upper adhesive film 23. Alternatively or additionally, when manganese (Mn) is placed at the boundary between the upper pad pattern PP_U and the lower adhesive film 13, the binding force between the upper pad pattern PP_U and the lower adhesive film 13 may be strengthened, as compared to a case where manganese (Mn) is not placed at the boundary between the upper pad pattern PP_U and the lower adhesive film 13. That is, a semiconductor device with improved reliability may be manufactured.

A semiconductor device, according to some embodiments, is described with reference to FIGS. 15 to 17. The semiconductor device illustrated in FIGS. 15 to 17 may be an image sensor. However, the present disclosure may not be limited in this regard. In some embodiments, the image sensor may be manufactured using the semiconductor device manufacturing method described with reference to FIGS. 1 to 14.

Figure 15:
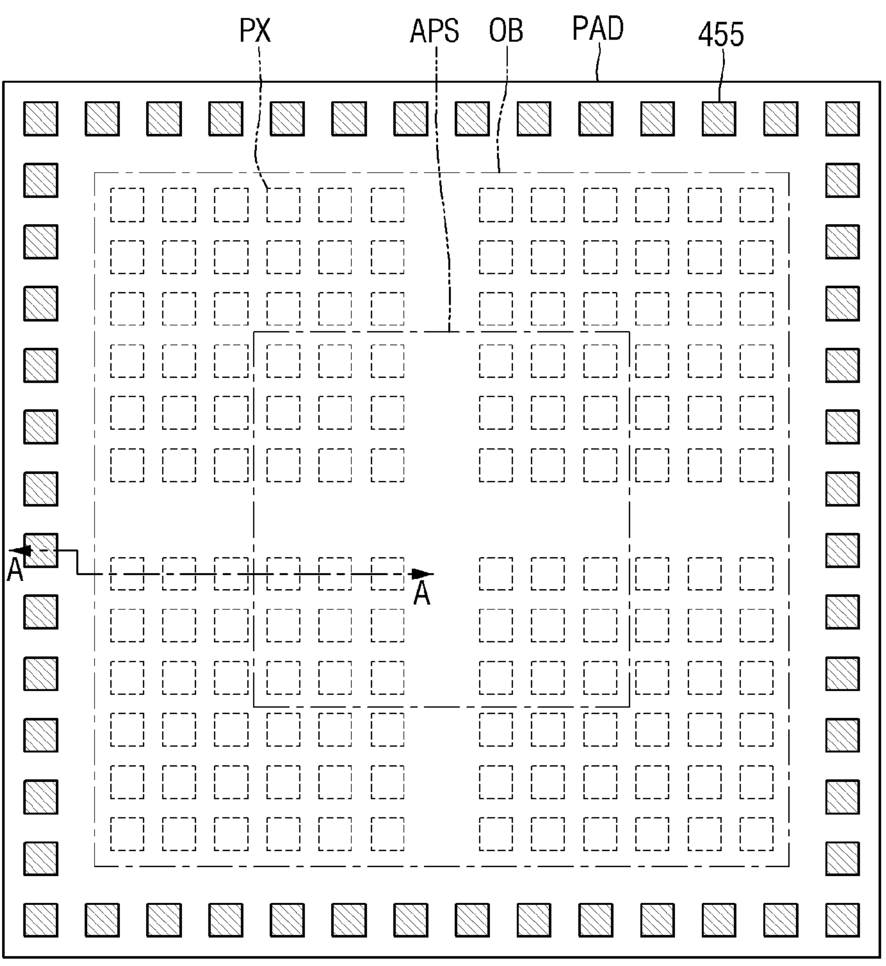
FIGS. 15 to 17 illustrate an exemplary semiconductor device, according to some embodiments.
Figure 15:
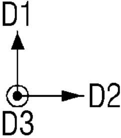
Figure 16:
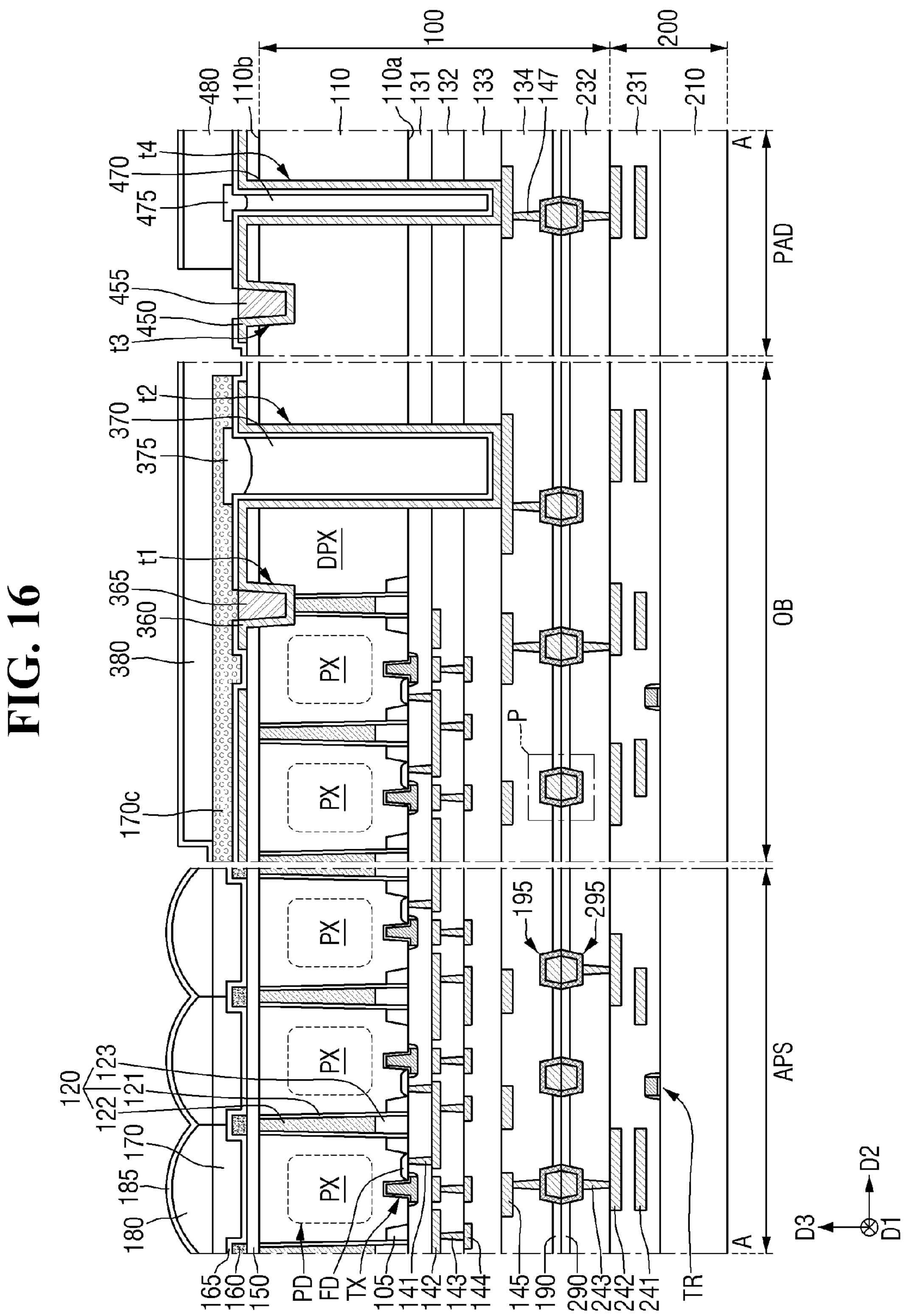
Figure 17:
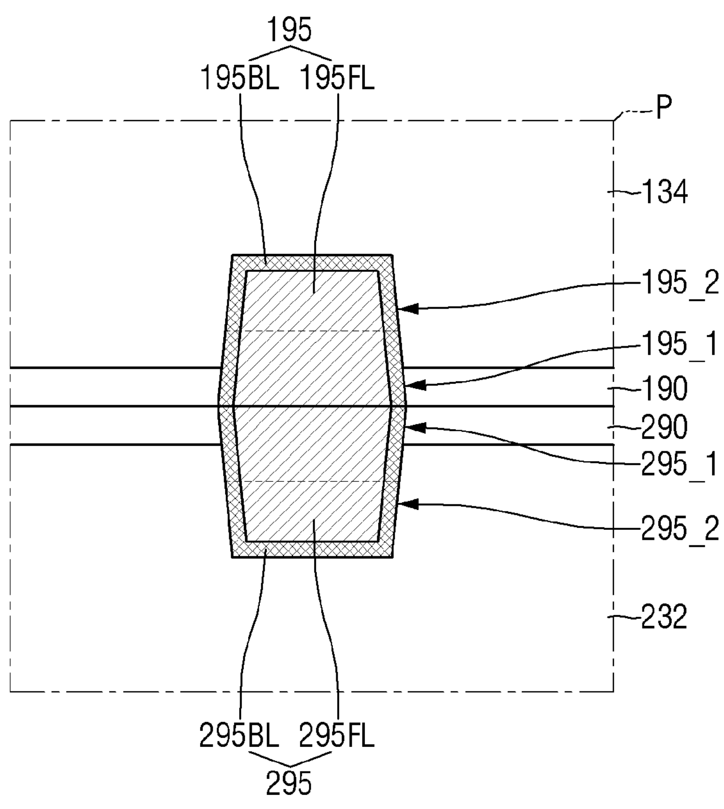

FIGS. 15 to 17 may illustrate the semiconductor device. For example, FIG. 15 may depict a plan view of the semiconductor device, according to some embodiments. FIG. 16 may be a cross-sectional view taken along line A-A of FIG. 15, and FIG. 17 may be an enlarged view of a region P of FIG. 15.

Referring to FIGS. 15 and 16, a semiconductor device may include a first semiconductor chip 100 and a second semiconductor chip 200. The first semiconductor chip 100 may be and/or may include a sensor chip, and the second semiconductor chip 200 may be and/or may include a logic chip. The first semiconductor chip 100 and the second semiconductor chip 200 may be bonded together.

The first semiconductor chip 100 may include a light-receiving region APS, a light-shielding region OB, and a pad region PAD. A plurality of unit pixel regions PX arranged two-dimensionally (e.g., in the form of a matrix) may be formed in the light-receiving region APS and the light-shielding region OB. The unit pixel regions PX may be arranged in the form a matrix inside a plane in which a first direction D1 and a second direction D2 extend. In some embodiments, the first direction D1 and the second direction D2 may intersect each other. Alternatively or additionally, the first direction D1 and the second direction D2 may be substantially perpendicular to each other. A third direction D3 may be substantially perpendicular to the first direction D1 and the second direction D2.

Active pixels that may receive light to generate active signals may be placed in the light-receiving region APS. Alternatively or additionally, optical black pixels that may block light to generate optical black signals may be placed in the light-shielding region OB. In some embodiments, the light-shielding region OB may be formed, for example, along the periphery of the light-receiving region APS. However, the present disclosure may not be limited in this regard. In some embodiments, dummy unit pixel regions DPX may be formed in the light-shielding region OB. The dummy unit pixel region DPX may be a pixel that may not generate an active signal.

The pad region PAD may be formed around the light-shielding region OB. In some embodiments, the pad region PAD may be formed to be adjacent the edge of the semiconductor device. However, the present disclosure may not be limited in this regard. The pad region PAD may be connected to an external device and/or the like and may be configured to transmit and/or receive electrical signals between the semiconductor device and the external device. For example, a second pad structure 455 may be provided on the first substrate 110 of the pad region PAD. The second pad structure 455 may be connected to an external device or the like.

The semiconductor device may include a first substrate 110, a pixel isolation pattern 120, a surface insulating film 150, a first color filter 170, a grid pattern 160, a microlens 180, a second substrate 210, a first pad structure 365, and a second pad structure 455.

The first substrate 110 may be and/or may include a semiconductor substrate. For example, the first substrate 110 may be bulk silicon and/or silicon-on-insulator (SOI). The first substrate 110 may be a silicon substrate, and/or may include other materials, for example, silicon germanium (SiGe), indium antimonide (InSb), lead telluride (PbTe), indium arsenide (InAs), indium phosphide (InP), gallium arsenide (GaAs) and/or gallium antimonide (GaSb). Alternatively or additionally, the first substrate 110 may be an epitaxial layer formed on a base substrate.

The first substrate 110 may include a first side 110*a* and a second side 110*b* that may be opposite to each other. In some embodiments, the second side 110*b* of the first substrate 110 may be and/or may include a light-receiving face on which light is incident. That is, an image sensor, according to some embodiments, may be a back illuminated (BSI) image sensor.

A plurality of unit pixel regions PX may be formed in the first substrate 110 of the light-receiving region APS and the light-shielding region OB. Each unit pixel region PX may include a photoelectric conversion layer PD. The first substrate 110 of the light-shielding region OB may include a dummy unit pixel region DPX that may not include the photoelectric conversion layer PD. However, the present disclosure may not be limited thereto. A signal generated in the dummy unit pixel region DPX may be used as information for removing process noise thereafter.

Each unit pixel region PX may include a photoelectric conversion layer PD, a floating diffusion region FD, and a transfer transistor TX. The photoelectric conversion layer PD may be formed in the first substrate 110 of the light-receiving region APS and the light-shielding region OB. The photoelectric conversion layer PD may generate charges in proportion to an amount of light incident from the outside. The photoelectric conversion layer PD may transfer the generated and accumulated charges to the floating diffusion region FD.

The floating diffusion region FD may be formed in the first substrate 110 of the light-receiving region APS and the light-shielding region OB. The floating diffusion region FD may be formed in the first side 110*a* of the first substrate 110.

Charges transferred to the floating diffusion region FD may be applied to the source follower gate.

The transfer transistor TX may be buried inside first substrate 110. One end of the transfer transistor TX may be connected to the photoelectric conversion layer PD, and the other end of the transfer transistor TX may be connected to the floating diffusion region FD. For example, the transfer transistor TX may transfer the charges generated from the photoelectric conversion layer PD to the floating diffusion region FD.

The transfer transistor TX may include a transfer gate, a gate insulating film, and a gate spacer. The transfer gate may include a portion buried in the first substrate 110. The gate insulating film may be placed between the transfer gate and the first substrate 110. The gate spacer may be placed on both side walls of the transfer gate.

A pixel isolation pattern 120 may be formed in the first substrate 110. The pixel isolation pattern 120 may be formed by filling a deep trench, which may be formed by patterning the first substrate 110, with an insulating material. The pixel isolation pattern 120 may penetrate through the first substrate 110 in the third direction D3. For example, the pixel isolation pattern 120 may extend from the first side 110*a* to the second side 110*b*. The pixel isolation pattern 120 may be a front deep trench isolation (FDTI).

Alternatively or additionally, the pixel isolation pattern 120 may be a back deep trench isolation (BDTI). In such embodiments, the pixel isolation pattern 120 may extend from the second side 110*b* toward the first side 110*a*. A width of the pixel isolation pattern 120 in the second direction D2 may gradually decrease from the second side 110*b* toward the first side 110*a*.

In some embodiments, the pixel isolation pattern 120 may include a lower portion and an upper portion. The upper portion of the pixel isolation pattern 120 may be placed on the lower portion of the pixel isolation pattern 120. The upper face of the upper portion of the pixel isolation pattern 120 may be the second side 110*b*. The lower face of the lower portion of the pixel isolation pattern 120 may be the first side 110*a*. The lower portion of the pixel isolation pattern 120 may be formed from the first side 110*a* to the lower face of the upper portion of the pixel isolation pattern 120 using a doping process.

The pixel isolation pattern 120 may define (e.g., delineate) a plurality of unit pixel regions PX and a dummy unit pixel region DPX. The pixel isolation pattern 120 may be formed in a grid pattern from a planar point of view, and may separate the plurality of unit pixel regions PX and the dummy unit pixel region DPX.

From the planar point of view, the pixel isolation pattern 120 may have a lattice structure. From the planar point of view, the pixel isolation pattern 120 may surround each unit pixel region PX. The pixel isolation pattern 120 may have a lattice structure extending in the first direction D1 and the second direction D2.

The pixel isolation pattern 120 may include a liner film 121, a conductive film 122, and a capping film 123. The liner film 121 may be placed along the side walls of the pixel isolation trench. The conductive film 122 may be placed between the liner films 121. The capping film 123 may be placed on the conductive film 122.

The liner film 121 may include an oxide film having a lower refractive index than the first substrate 110. For example, the liner film 121 may include, but may not be limited to, at least one of silicon oxide (SiO), aluminum oxide ($Al_2O_3$), tantalum oxide (TaO), and/or combinations thereof. The liner film 121 may refract or reflect light obliquely incident on the photoelectric conversion layer PD. Alternatively or additionally, the liner film 121 may prevent photocharges generated in a specific unit pixel region PX by incident light from moving to an adjacent unit pixel region PX by a random drift. That is, the liner film 121 may improve the light-receiving rate of the photoelectric conversion layer PD to improve the quality of the image sensor, when compared to related image sensors.

In some embodiments, the conductive film 122 may include a conductive material. For example, the conductive film 122 may include, but may not be limited thereto, polysilicon (poly Si). In some embodiments, a negative voltage may be applied to the conductive film 122 that may include a conductive material. Accordingly, an electrostatic discharge (ESD) bruise failure of the image sensor may be effectively prevented. As used herein, the ESD bruise defect may refer to a phenomenon in which electric charges generated by ESD or the like may be accumulated on the surface of the substrate (e.g., the second side 110*b*) of the substrate to generate a bruise-like defect on the image to be generated.

In some embodiments, the capping film 123 may include an insulating material. For example, the capping film 123 may include, but not be limited to, a silicon-based insulating material (e.g., silicon nitride (SiN), silicon oxide (SiO), silicon oxynitride ($SiO_xN_y$), and a high dielectric constant material (e.g., hafnium oxide ($HfO_2$) and aluminum oxide ($Al_2O_3$)).

In some embodiments, the element isolation pattern 105 may be provided. That is, the element isolation pattern 105 may be placed in the first substrate 110. For example, the element isolation pattern 105 may be placed in a trench formed by partially recessing the first substrate 110. The trench may be recessed from the first side 110*a* of the first substrate 110. The element isolation pattern 105 may be a shallow element isolation (STI) film. In some embodiments, the element isolation pattern 105 may define (e.g., delineate) active regions.

A width of the element isolation pattern 105 in the second direction D2 may gradually decrease from the first side 110*a* of the first substrate 110 toward the second side 110*b*. The element isolation pattern 105 may overlap the pixel isolation pattern 120 in the second direction D2 or the first direction D1. The pixel isolation pattern 120 may penetrate the element isolation pattern 105 in the third direction D3. The element isolation pattern 105 may include an insulating material. The element isolation pattern 105 may include, for example, at least one of silicon nitride (SiN), silicon oxide (SiO), and silicon oxynitride ($SiO_xN_y$).

The semiconductor device according to some embodiments may further include first inter-wiring insulating films (e.g., first first inter-wiring insulating film 131, second first inter-wiring insulating film 132, third first inter-wiring insulating film 133, and fourth first inter-wiring insulating film 134). The first inter-wiring insulating films 131 to 134 may be formed on the first side 110*a* of the first substrate 110. For example, the first inter-wiring insulating films 131 to 134 may cover the first side 110*a* of the first substrate 110. The first substrate 110 and the first inter-wiring insulating films 131 to 134 may constitute the first semiconductor chip 100. In FIG. 16, although the first inter-wiring insulating films 131 to 134 are shown as being divided into four layers, the present disclosure may not be limited thereto. That is, the number of layers of the first inter-wiring insulating films 131 to 134 illustrated in FIG. 16 may be only examples.

The first inter-wiring insulating films 131 to 134 may include, for example, but may not be limited to, at least one of silicon oxide (SiO), silicon nitride (SiN), silicon oxynitride ($SiO_xN_y$) or a low dielectric constant (low-k) material having a lower dielectric constant than silicon oxide (SiO).

A plurality of first contacts (e.g., first first contact 141 and second first contact 143) and a plurality of first wiring patterns (e.g., first first wiring pattern 142, second first wiring pattern 144, and third first wiring pattern 145) may be provided inside the first inter-wiring insulating films 131 to 134. The plurality of first contacts 141 and 143 may electrically connect (e.g., couple) the floating diffusion region FD and the plurality of first wiring patterns 142 to 145. Some of the plurality of first wiring patterns 142 to 145 may be connected to the first connecting structure 360. However, the present disclosure may not be limited thereto.

Each of the first contacts 141 and 143 and the first wiring patterns 142 145 may include, for example, but may not be limited to, at least one of tungsten (W), copper (Cu), aluminum (Al), gold (Au), silver (Ag), and/or alloys thereof.

A first adhesive film 190 may be placed along the lower faces of the first inter-wiring insulating films 131 to 134. In some embodiments, the first adhesive film 190 may be formed of an insulating material. For example, the first adhesive film 190 may include, but may not be limited to, silicon carbonitride (SiCN).

A first pad pattern 195 may be placed inside the first inter-wiring insulating films 131 to 134. The lower face of the first pad pattern 195 may be coplanar with the lower face of the first adhesive film 190. The first pad pattern 195 may be substantially similar and/or the same as the upper pad pattern PP_U described with reference to FIGS. 1 to 5.

A first via contact 147 may be placed on the first pad pattern 195. The first pad pattern 195 and the first wiring patterns 142 to 145 may be connected through the first via contact 147. In some embodiments, the first via contact 147 may be formed of a conductive material. For example, the first via contact 147 may be made of and/or may include copper (Cu).

The second substrate 210 may be and/or may include bulk silicon or silicon-on-insulator (SOI). The second substrate 210 may be a silicon substrate, and/or may include other materials, for example, but not limited to, silicon germanium (SiGe), indium antimonide (InSb), lead telluride (PbTe), indium arsenide (InAs), indium phosphide (InP), gallium arsenide (GaAs), and/or gallium antimonide (GaSb). Alternatively or additionally, the second substrate 210 may be and/or may include an epitaxial layer formed on a base substrate.

The second substrate 210 may include an upper side and a lower side. The upper side of the second substrate 210 may be a side that may face the first semiconductor chip 100. The lower side of the second substrate 210 may be a side that may be opposite to the upper side of the second substrate 210.

A plurality of transistors TR may be formed on the upper side of the second substrate 210. The transistors TR may be and/or may include, for example, a logic circuit. The transistors TR may control the transfer transistor TX, the reset transistor, the selection transistor, and the source follower transistor.

The second inter-wiring insulating films (e.g., first second inter-wiring insulating film 231 and second second inter-wiring insulating film 232) may be formed on the second substrate 210. For example, the second inter-wiring insulating films 231 and 232 may at least partially cover the upper face of the second substrate 210. The second substrate 210 and the second inter-wiring insulating films 231 and 232 may constitute the second semiconductor chip 200. The second inter-wiring insulating films 231 and 232 may include, for example, but may not be limited to, at least one of silicon oxide (SiO), silicon nitride (SiN), silicon oxynitride ($SiO_xN_y$), and a low dielectric constant (low-k) material having a dielectric constant lower than that of silicon oxide (SiO).

A plurality of second wiring patterns (e.g., first second wiring pattern 241 and second second wiring pattern 242) may be placed inside the second inter-wiring insulating films 231 and 232. The plurality of second wiring patterns 241 and 242 may each be connected to the transistor TR, and/or may be connected to the floating diffusion region FD of the first semiconductor chip 100.

Each of the second wiring patterns 241 and 242 may include, for example, but may not be limited to, at least one of tungsten (W), copper (Cu), aluminum (Al), gold (Au), silver (Ag), and/or alloys thereof.

A second adhesive film 290 may be placed along the upper faces of the second inter-wiring insulating films 231 and 232. The second adhesive film 290 may be formed of an insulating material. For example, the second adhesive film 290 may include, but may not be limited to, silicon carbonitride (SiCN).

A second pad pattern 295 may be placed inside the second inter-wiring insulating films 231 and 232. The upper face of the second pad pattern 295 may be coplanar with the upper face of the second adhesive film 290. The second pad pattern 295 may be substantially similar and/or the same as the lower pad pattern PP_L discussed with reference to FIGS. 1 to 5.

A second via contact 243 may be placed under the second pad pattern 295. The second pad pattern 295 and the second wiring patterns 241 and 242 may be connected through the second via contact 243. The second via contact 243 may be formed of a conductive material. For example, the second via contact 243 may be formed of, but not limited to, copper (Cu).

The surface insulating film 150 may be formed on the second side 110*b* of the first substrate 110. The surface insulating film 150 may extend along the second side 110*b* of the first substrate 110. In some embodiments, at least a part of the surface insulating film 150 may be in contact with the pixel isolation pattern 120.

The surface insulating film 150 may include an insulating material. For example, the surface insulating film 150 may include, but may not be limited to, at least one of silicon oxide (SiO), silicon nitride (SiN), silicon oxynitride ($SiO_xN_y$), aluminum oxide ($Al_2O_3$), hafnium oxide ($HfO_2$), and/or combinations thereof.

The surface insulating film 150 may function as an antireflection film to prevent reflection of light to be incident on the first substrate 110, thereby potentially improving the light-receiving rate of the photoelectric conversion layer PD. Alternatively or additionally, the surface insulating film 150 may function as a planarization film, and/or may form a first color filter 170 and a microlens 180 with a uniform height, as described below.

The first color filter 170 may be formed on the surface insulating film 150 of the light-receiving region APS. In some embodiments, the first color filter 170 may be arranged to correspond to each unit pixel region PX. For example, the plurality of first color filters 170 may be arranged two-dimensionally (e.g., in the form of a matrix).

The first color filter 170 may have various color filters according to the unit pixel region PX. For example, the first color filter 170 may be arranged in a Bayer pattern that may include a red color filter, a green color filter, and a blue color filter. However, the present disclosure may not be limited in this regard. For example, the first color filters 170 may include a yellow filter, a magenta filter, and a cyan filter, and/or may further include a white filter, without deviating from the scope of the present disclosure.

A grid pattern 160 may be formed on the surface insulating film 150. The grid pattern 160 may be formed in a grid pattern from a planar point of view, and/or may be interposed between the plurality of first color filters 170.

The grid pattern 160 may include a low refractive index material having a lower refractive index than silicon (Si). For example, the grid pattern 160 may include, but may not limited to, at least one of silicon oxide (SiO), aluminum oxide ($Al_2O_3$), tantalum oxide (TaO), and/or combinations thereof. In some embodiments, the grid pattern 160 may potentially improve the quality of the image sensor, by refracting or reflecting light obliquely incident on the image sensor, when compared to related image sensors.

In some embodiments, a first protective film 165 may be formed on the surface insulating film 150 and the grid pattern 160. The first protective film 165 may be interposed between the surface insulating film 150 and the first color filters 170, and between the grid pattern 160 and the first color filter 170. For example, the first protective film 165 may extend along the profile of the upper face of the surface insulating film 150, and the side faces and the upper face of the grid pattern 160.

The first protective film 165 may include, for example, but may not be limited to, aluminum oxide ($Al_2O_3$). In some embodiments, the first protective film 165 may prevent damage of the surface insulating film 150 and the grid pattern 160.

A microlens 180 may be formed on the first color filter 170. The microlens 180 may be arranged to correspond to each unit pixel region PX. For example, the microlenses 180 may be arranged two-dimensionally (e.g., in the form of a matrix) in a plane.

The microlens 180 may have a convex shape, and/or may have a predetermined radius of curvature. Accordingly, the microlens 180 may condense the light which may be incident on the photoelectric conversion layer PD. The microlens 180 may include, for example, but may not be limited to, a light transmissive resin.

In some embodiments, a second protective film 185 may be formed on the microlens 180. The second protective film 185 may extend along the surface of the microlens 180. The second protective film 185 may include, for example, an inorganic oxide film. The second protective film 185 may include, but may not be limited to, at least one of silicon oxide (SiO), titanium oxide (TiO), zirconium oxide (ZrO), hafnium oxide ($HfO_2$), and/or combinations thereof. In some embodiments, the second protective film 185 may include a low temperature oxide (LTO).

The second protective film 185 may protect the microlens 180 from the outside. For example, the second protective film 185 may protect the microlens 180 including an organic substance, by including an inorganic oxide film. Alternatively or additionally, the second protective film 185 may improve the light condensing capability of the microlens 180. For example, the second protective film 185 may reduce reflection, refraction, scattering, and the like of incident light that reaches the space between the microlenses 180, by filling the space between the microlenses 180.

A semiconductor device, according to some embodiments, may further include a first connecting structure 360 and a second connecting structure 450.

The first connecting structure 360 may be formed inside the light-shielding region OB. The first connecting structure 360 may shield light incident on the light-shielding region OB. The first connecting structure 360 may be formed on the surface insulating film 150 of the light-shielding region OB. The first connecting structure 360 may be in contact with the pixel isolation pattern 120. The first connecting structure 360 may be connected to the conductive film 122 of the pixel isolation pattern 120.

For example, a first trench t1 that may expose the conductive film 122 may be formed in the first substrate 110 and the surface insulating film 150 of the light-shielding region OB. The first connecting structure 360 may be formed in the first trench t1, and/or may be in contact with the conductive film 122 in the light-shielding region OB. The first connecting structure 360 may extend along the profile of the side walls and bottom face of the first trench t1.

The first connecting structure 360 may be electrically connected to the conductive film 122. For example, the first connecting structure 360 may be electrically connected with the conductive film 122. The first connecting structure 360 may include, for example, a titanium (Ti) film, a titanium nitride (TiN) film, and a tungsten (W) film, which may be sequentially stacked.

In some embodiments, a first pad structure 365 may be formed on the first connecting structure 360. The first pad structure 365 may at least partially fill the first trench t1 that may remain after the first connecting structure 360 is filled. A voltage may be applied to the conductive film 122 of the pixel isolation pattern 120 through the first pad structure 365. Accordingly, charges generated by ESD or the like may be discharged to the first pad structure 365 through the conductive film 122, and an ESD bruise defect may be prevented.

The first pad structure 365 may include, for example, but may not be limited to, at least one of tungsten (W), copper (Cu), aluminum (Al), gold (Au), silver (Ag), and/or alloys thereof.

In some embodiments, a second trench t2 may be formed in the first substrate 110 of the light-shielding region OB. The second trench t2 may expose a part of the first wiring pattern 145 of the first semiconductor chip 100. The first connecting structure 360 may be formed in the second trench t2 and/or may connect the first wiring pattern 145. The first connecting structure 360 may extend along one or more side walls and a bottom face of the first trench t1.

In some embodiments, a first filling insulating film 370 may be formed on the first connecting structure 360. The first filling insulating film 370 may at least partially fill the second trench t2 that may remain after the first connecting structure 360 is filled. The first filling insulating film 370 may include, for example, but may not be limited to, at least one of silicon oxide, aluminum oxide, tantalum oxide, and combinations thereof.

In some embodiments, a first capping pattern 375 may be formed on the first filling insulating film 370. The first capping pattern 375 may include a silicon-based insulating material (e.g., silicon nitride (SiN), silicon oxide (SiO), and silicon oxynitride ($SiO_xN_y$)) and/or a high dielectric material (e.g., hafnium oxide ($HfO_2$) and aluminum oxide ($Al_2O_3$)). In some embodiments, the first capping pattern 375 may include substantially similar and/or the same material as the capping film 123. However, the present disclosure may not be limited thereto.

In some embodiments, a second color filter **170*c* may be formed on the first connecting structure 360. For example, the second color filter 170*c* may be formed to partially cover the first protective film 165** in the light-shielding region OB.

The second color filter 170*c* may include, for example, but may not be limited to, a blue color filter.

In some embodiments, a third protective film 380 may be formed on the second color filters 170*c*. For example, the third protective film 380 may be formed to partially cover the first protective film 165 in the light-shielding region OB. In some embodiments, the second protective film 185 may extend along the surface of the third protective film 380. The third protective film 380 may include, for example, but may not be limited to, a light transmissive resin. In some embodiments, the third protective film 380 may include a substantially similar and/or the same material as the microlens 180.

The second connecting structure 450 may be formed in the pad region PAD. For example, the second connecting structure 450 may be formed on the surface insulating film 150 of the pad region PAD.

In some embodiments, a third trench t3 may be formed in the first substrate 110 of the pad region PAD. The second connecting structure 450 may partially fill the third trench t3. The second connecting structure 450 may be formed along one or more side walls and a bottom face of the third trench t3.

A fourth trench t4 that may expose the first wiring pattern 145 may be formed in the first semiconductor chip 100 of the pad region PAD. The second connecting structure 450 may partially fill the fourth trench t4. The second connecting structure 450 may be formed along the side wall and the bottom face of the fourth trench t4.

The second connecting structure 450 may be formed in the fourth trench t4, and may be in contact with a part of the first wiring pattern 145. The second connecting structure 450 may electrically connect a part of the first wiring pattern 145 with the second pad structure 455. The second connecting structure 450 may include, for example, a titanium (Ti) film, a titanium nitride (TiN) film, and a tungsten (W) film that may be sequentially stacked.

A second pad structure 455 may be formed on the second connecting structure 450. The second pad structure 455 may fill the third trench t3 that remains after the second connecting structure 450 is filled. The second pad structure 455 may include, for example, but may not be limited to, at least one of tungsten (W), copper (Cu), aluminum (Al), gold (Au), silver (Ag), and/or alloys thereof.

In some embodiments, a part of the second pad structure 455 may be exposed. For example, an exposure opening that exposes the second pad structure 455 may be formed. Accordingly, the second pad structure 455 may be connected to an external device or the like, and/or the second pad structure 455 may be configured to transmit and/or receive electrical signals between the semiconductor device and the external device.

A second filling insulating film 470 may be formed on the second connecting structure 450. The second filling insulating film 470 may at least partially fill the fourth trench t4 that may remain after the second connecting structure 450 is filled. The second filling insulating film 470 may include, for example, but may not be limited to, at least one of silicon oxide (SiO), aluminum oxide ($Al_2O_3$), tantalum oxide (TaO), and combinations thereof.

In some embodiments, a second capping pattern 475 may be formed on the second filling insulating film 470. The second capping pattern 475 may include a silicon-based insulating material (e.g., silicon nitride (SiN), silicon oxide (SiO), and silicon oxynitride ($SiO_xN_y$)) and a high dielectric material (e.g., hafnium oxide ($HfO_2$) and aluminum oxide ($Al_2O_3$)). In some embodiments, the second capping pattern 475 may include a substantially similar and/or the same material as the capping film 121C. However, the present disclosure may not be limited thereto.

In some embodiments, a fourth protective film 480 may be formed on the second connecting structure 450 of the pad region PAD. For example, the fourth protective film 480 may be formed to partially cover the first protective film 165 in the pad region PAD. In some embodiments, the second protective film 185 may extend along the surface of the fourth protective film 480. The fourth protective film 480 may include, for example, but may not be limited to, light transmissive resin. In some embodiments, the fourth protective film 480 may include a substantially similar and/or the same material as the microlens 180.

In FIG. 17, the first pad pattern 195 may include a first barrier film 195BL and a first filling film 195FL. Alternatively or additionally, the first pad pattern 195 may include a first portion 195_1 and a second portion 195_2. The first portion 195_1 of the first pad pattern 195 may refer to a portion that may be in contact with the second pad pattern 295. The second portion 195_2 of the first pad pattern 195 may be placed on the first portion 195_1 of the first pad pattern 195. The concentration of manganese (Mn) of the second portion 195_2 of the first pad pattern 195 may be smaller than the concentration of manganese (Mn) of the first portion 195_1 of the first pad pattern 195.

The second pad pattern 295 may include a second barrier film 295BL and a second filling film 295FL. Alternatively or additionally, the second pad pattern 295 may include a first portion 295_1 and a second portion 295_2. The first portion 295_1 of the second pad pattern 295 may refer to a portion that is in contact with the first pad pattern 195. The second portion 295_2 of the second pad pattern 295 may be placed below the first portion 295_1 of the second pad pattern 295. The concentration of manganese (Mn) of the second portion 295_2 of the second pad pattern 295 may be smaller than the concentration of manganese (Mn) of the first portion 295_1 of the second pad pattern 295.

In some embodiments, the bonding of the first semiconductor chip 100 and the second semiconductor chip 200 together may include bonding of the first pad pattern 195 and the second pad pattern 295 together. As discussed above, according to some embodiments, since the bonding energy between the first pad pattern 195 and the second pad pattern 295 may be relatively high, the first semiconductor chip 100 and the second semiconductor chip 200 may be stably bonded.

Furthermore, according to some embodiments, the first pad pattern 195 and the second pad pattern 295 may be more stably bonded, even if the first pad pattern 195 and the second pad pattern 295 are misaligned with each other. Therefore, a semiconductor device with improved reliability may be manufactured, when compared to related semiconductor devices.

A semiconductor device according to some embodiments is described with reference to FIGS. 18 to 20. The semiconductor devices shown in FIGS. 18 to 20 may be and/or may include a flash memory device. The flash memory device may be manufactured, using the semiconductor device manufacturing method described with reference to FIGS. 1 to 14.

Figure 18:
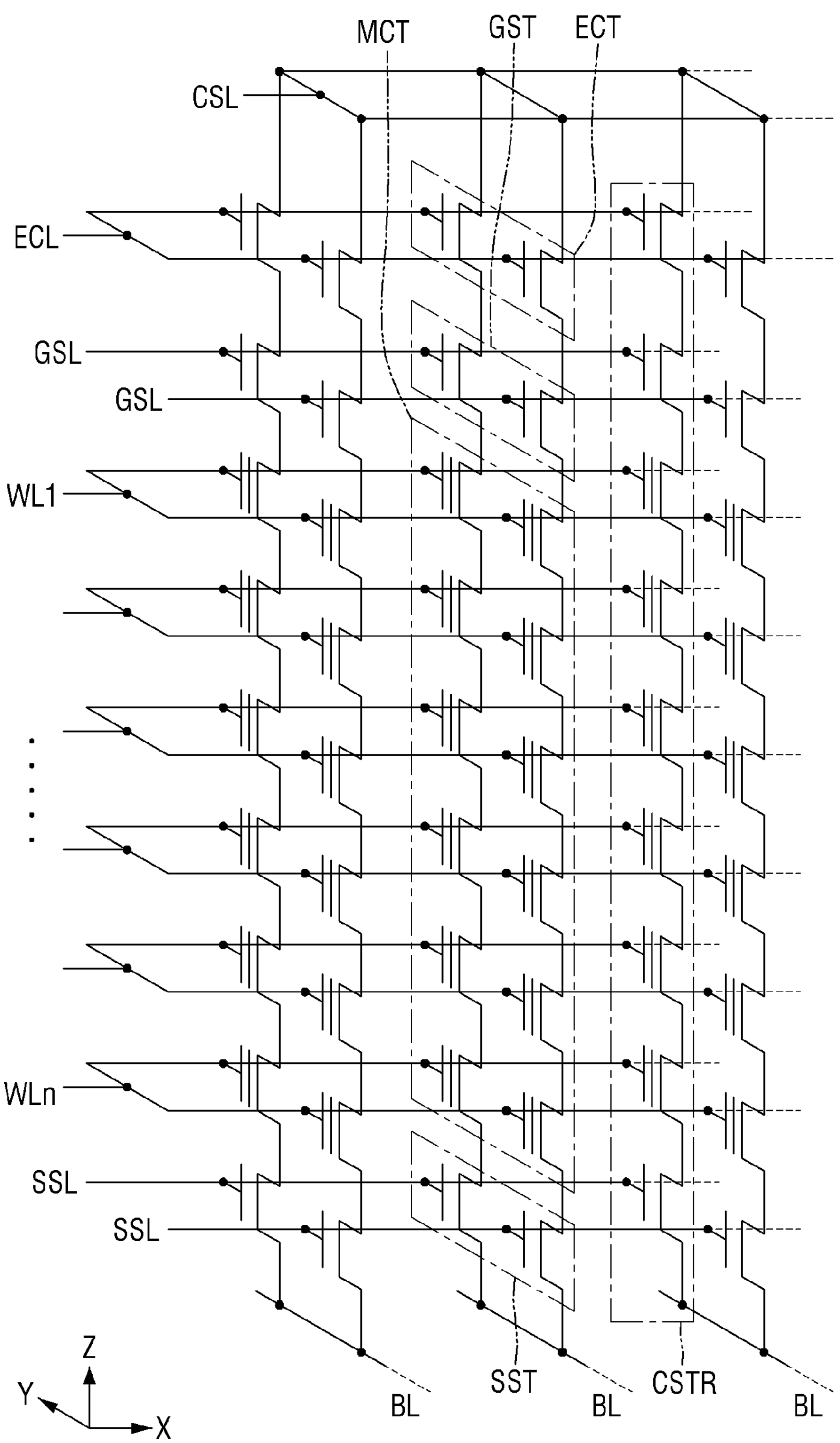
FIGS. 18 to 20 depict an example of a semiconductor device, according to some embodiments.
Figure 19:
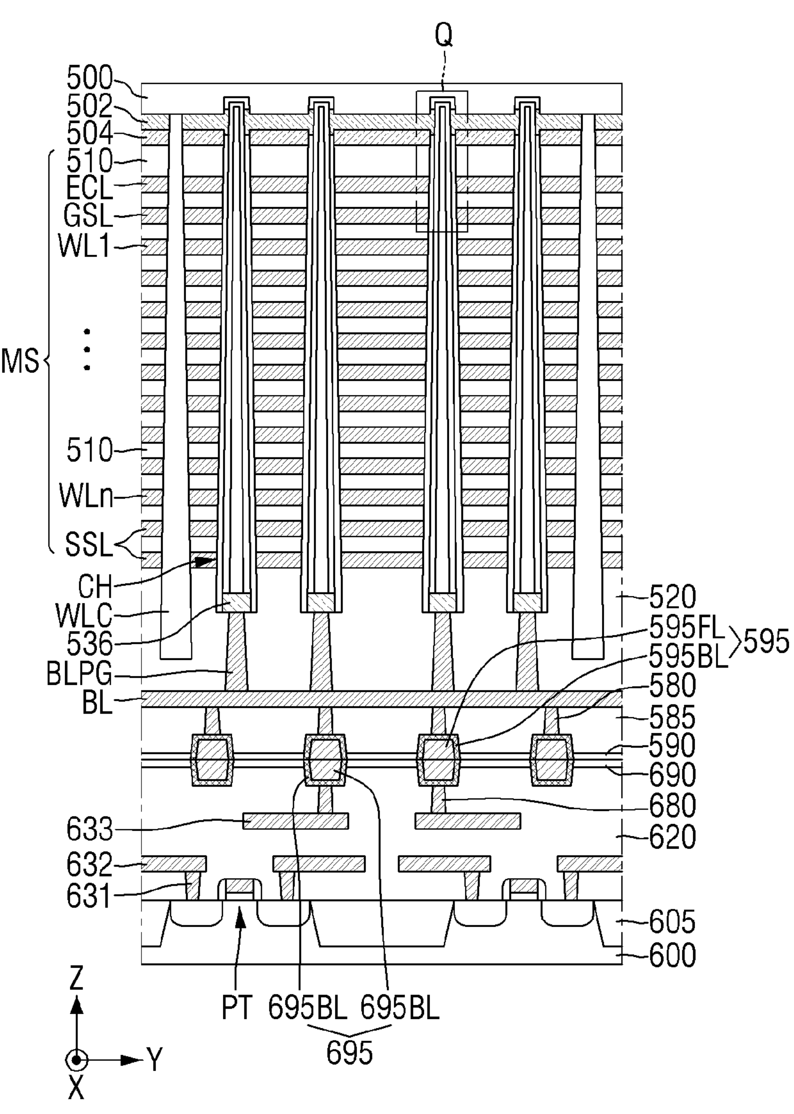
Figure 20:
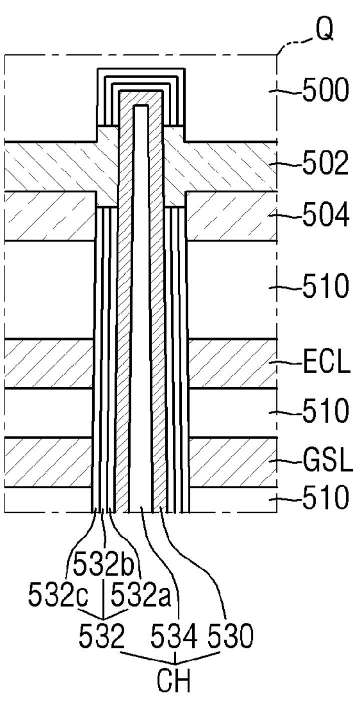

FIGS. 18 to 20 illustrate a semiconductor device according to some embodiments. Referring to FIG. 18, a circuit diagram of a flash memory device is illustrated. FIG. 19 illustrates a cross-sectional view of the flash memory device. FIG. 20 depicts an enlarged view of a region Q of FIG. 19.

As shown in FIG. 18, a memory cell array of a semiconductor device may include a common source line CSL, a plurality of bit lines BL, and a plurality of cell strings CSTR.

The common source line CSL may extend in an x-direction X. In some embodiments, a plurality of common source lines CSL may be arranged two-dimensionally. For example, the plurality of common source lines CSL may extend in the x-direction X while being spaced apart from each other. A substantially similar and/or the same voltage may be electrically applied to the common source lines CSL, and/or the common source lines CSL may be controlled separately by applying different voltages.

A plurality of bit lines BL may be arranged two-dimensionally. For example, the bit lines BL may extend in a y-direction Y, which may intersect the x-direction X, while being spaced apart from each other. A plurality of cell strings CSTR may be connected in parallel to each bit line BL. The cell strings CSTR may be commonly connected to the common source line CSL. That is, a plurality of cell strings CSTR may be placed between the bit lines BL and the common source line CSL.

Each cell string CSTR may include a ground selection transistor GST connected to the common source line CSL, a string selection transistor SST connected to the bit line BL, and a plurality of memory cell transistors MCT placed between the ground selection transistor GST and the string selection transistor SST. Each memory cell transistor MCT may include a data storage element. The ground selection transistor GST, the string selection transistor SST, and the memory cell transistors MCT may be connected in series in a z-direction Z. As used herein, the x-direction X, the y-direction Y, and the z-direction Z may be substantially perpendicular to each other.

The common source line CSL may be commonly connected to the sources of the ground selection transistors GST. Alternatively or additionally, a ground select line GSL, a plurality of word lines WL1 to WLn, and a string selection line SSL may be placed between the common source line CSL and the bit lines BL. The ground selection line GSL may be used as the gate electrode of the ground selection transistor GST, the word lines WL1 to WLn (where n is a positive integer greater than zero (0) may be used as the gate electrodes of the memory cell transistors MCT, and the string selection line SSL may be used as the gate electrode of the string selection transistor SST.

In some embodiments, an erasure control transistor ECT may be placed between the common source line CSL and the ground selection transistor GST. The common source line CSL may be commonly connected to the sources of the erasure control transistors ECT. Alternatively or additionally, an erasure control line ECL may be placed between the common source line CSL and the ground select line GSL. The erasure control line ECL may be used as the gate electrode of the erasure control transistor ECT. The erasure control transistors ECT may generate a gate induced drain leakage (GIDL) to perform the erasure operation of the memory cell array.

Referring to FIGS. 19 and 20, a semiconductor device may be and/or may include a chip-to-chip (C2C) structure. The C2C structure may refer to a structure in which an upper chip may be manufactured on a first wafer and a lower chip may be manufactured on a second wafer different from the first wafer, and the upper chip and the lower chip may be connected to each other by a bonding process. The bonding process may refer to a manner of electrically connecting a bonding metal formed on the uppermost metal layer of the upper chip and a bonding metal formed on the uppermost metal layer of the lower chip. For example, when the bonding metal is formed of copper (Cu), the bonding may be referred to as a Cu—Cu bonding. As another example, the bonding metal may be formed of other metals, such as, but not limited to, aluminum (Al) and/or tungsten (W).

As shown in FIG. 19, a semiconductor device may include a cell substrate 500, a mold structure MS, a first interlayer insulating film 520, a channel structure CH, a word line cutting structure WLC, a bit line BL, a peripheral circuit board 600, a peripheral circuit element PT, a first bonding pattern 595, and a second bonding pattern 695.

The cell substrate 500 may include, for example, a semiconductor substrate such as, but not limited to, a silicon (Si) substrate, a germanium (Ge) substrate or a silicon-germanium (Si—Ge) substrate. Alternatively or additionally, the cell substrate 500 may include a silicon-on-insulator (SOI) substrate, a germanium-on-insulator (GOI) substrate, and the like. In some embodiments, the cell substrate 500 may include impurities. For example, the cell substrate 500 may include n-type impurities (e.g., phosphorus (P), arsenic (As), and the like).

The mold structure MS may be provided on a front side of the cell substrate 500. The mold structure MS may include a plurality of gate electrodes (e.g., ECL, GSL and WL1 to WLn, and SSL) and a plurality of mold insulating films 510 which may be alternately stacked on the cell substrate 500. Each of the gate electrodes (e.g., ECL, GSL, WL1 to WLn, and SSL), and each mold insulating film 510 may have a layered structure that may extend parallel to the front side of the cell substrate 500. The gate electrodes (e.g., ECL, GSL, WL1 to WLn, and SSL) may be spaced apart from each other by the mold insulating film 510 and/or may be sequentially stacked on the cell substrate 500.

In some embodiments, the gate electrodes (e.g., ECL, GSL, WL1 to WLn, and SSL) may include an erasure control line ECL, a ground selection line GSL, and a plurality of word lines WL1 to WLn which may be sequentially stacked on the cell substrate 500. In some other embodiments, the erasure control line ECL may be omitted.

The gate electrodes (e.g., ECL, GSL, WL1 to WLn, and SSL) may each include, but may not be limited to, a conductive material, for example, a metal such as tungsten (W), cobalt (Co), and nickel (Ni), and/or a semiconductor material such as silicon (Si). For example, the gate electrodes (e.g., ECL, GSL, WL1 to WLn, and SSL) may each include tungsten (W). The gate electrodes (e.g., ECL, GSL, WL1 to WLn, and SSL) may be and/or may include multi-films. For example, when the gate electrodes (e.g., ECL, GSL, WL1 to WLn, and SSL) are multi-films, the gate electrodes (e.g., ECL, GSL, WL1 to WLn, and SSL) may include a gate electrode barrier film and a gate electrode filling film. The gate electrode barrier film may include, for example, titanium nitride (TiN), and/or the gate electrode filling film may include tungsten (W). However, the present disclosure may not be limited thereto.

The mold insulating film 510 may include an insulating material, for example, but may not be limited to, at least one of silicon oxide (SiO), silicon nitride (SiN), and silicon oxynitride ($SiO_xN_y$). As an example, the mold insulating layer 510 may include silicon oxide (SiO).

A channel structure CH may be provided in the mold structure MS. The channel structure CH may penetrate the mold structure MS. For example, the channel structure CH may have a pillar shape (e.g., a cylindrical shape) extending in the z-direction Z. Therefore, the channel structure CH may intersect each of the gate electrodes (e.g., ECL, GSL, WL1 to WLn, and SSL). The channel structure CH may be placed in a channel hole passing through the mold structure MS.

In some embodiments, the channel structure CH may include a semiconductor pattern 530 and an information storage film 532.

The semiconductor pattern 530 may extend in the z-direction Z and penetrate the mold structure MS. Although the semiconductor pattern 530 is shown to have a cup shape, this is only an example. For example, the semiconductor pattern 530 may have various shapes such as, but not limited to, a cylindrical shape, a rectangular barrel shape, a solid filler shape, and the like. The semiconductor pattern 530 may include, for example, but may not be limited to, a semiconductor material such as, but not limited to, single crystal silicon, polycrystalline silicon, organic semiconductor substance, and carbon nanostructure.

The information storage film 532 may be interposed between the semiconductor pattern 530 and each of the gate electrodes (e.g., ECL, GSL and WL1 to WLn, and SSL). For example, the information storage film 532 may extend along the outer side face of the semiconductor pattern 530. As another example, the information storage film 532 may extend along the side wall and the bottom face of the semiconductor pattern 530. The information storage film 532 may include, for example, at least one of silicon oxide (SiO), silicon nitride (SiN), silicon oxynitride ($SiO_xN_y$), and/or high dielectric constant materials having a higher dielectric constant than silicon oxide (SiO). The high dielectric constant material may include, for example, at least one of aluminum oxide ($Al_2O_3$), hafnium oxide ($HfO_2$), lanthanum oxide (LaO), tantalum oxide (TaO), titanium oxide (TiO), lanthanum hafnium oxide (LaHfO), lanthanum aluminum oxide (LaAlO), dysprosium scandium oxide (DyOSc), and/or combinations thereof.

In some embodiments, the information storage film 532 may be formed of multi-films. For example, as shown in FIG. 20, the information storage film 532 may include a tunnel insulating film 532*a*, a charge storage film 532*b*, and a blocking insulating film 532*c*, which may be sequentially stacked on the outer side face of the semiconductor pattern 530.

The tunnel insulating film 532*a* may include, for example, silicon oxide (SiO) or a high dielectric constant material having a higher dielectric constant than silicon oxide (e.g., aluminum oxide ($Al_2O_3$) and hafnium oxide ($HfO_2$)). The charge storage film 532*b* may include, for example, silicon nitride (SiN). The blocking insulating film 532*c* may include, for example, silicon oxide (SiO) and/or a high dielectric constant material having a higher dielectric constant than silicon oxide (e.g., aluminum oxide ($Al_2O_3$), and hafnium oxide ($HfO_2$)).

In some embodiments, the channel structure CH may further include a filling pattern 534. The filling pattern 534 may be formed to at least partially fill the inside of the cup-shaped semiconductor pattern 530. The filling pattern 534 may include, but may not be limited to, an insulating material, for example, silicon oxide (SiO).

In some embodiments, the channel structure CH may further include a channel pad 536. The channel pad 536 may be formed to be connected to the semiconductor pattern 530. For example, the channel pad 536 may be formed in a first interlayer insulating film 520 and connected to the upper part of the semiconductor pattern 530. The channel pad 536 may include, for example, but may not be limited to, impurity-doped polysilicon.

In some embodiments, a source layer 502 and a source support layer 504 may be placed on the cell substrate 500. The source layer 502 and the source support layer 504 may be interposed between the cell substrate 500 and the mold structure MS.

In some embodiments, the source layer 502 may be formed to be connected to the semiconductor pattern 530 of the channel structure CH. For example, as shown in FIG. 20, the source layer 502 may penetrate the information storage film 532, and may be in contact with the semiconductor pattern 530. As another example, the source layer 502 may penetrate side walls of the information storage film 532, and may be connected to the semiconductor pattern 530.

In some embodiments, a source layer 502 may be provided as a common source line (e.g., CSL of FIG. 18) of a semiconductor memory device. The source layer 502 may be formed of, for example, but may not be limited to, an impurity-doped polysilicon film and/or a conductive film.

The word line cutting structure WLC may cut the mold structure MS. The word line cutting structure WLC may cut the gate electrodes (e.g., ECL, GSL, WL1 to WLn, and SSL). The mold structure MS may be cut by the word line cutting structure WLC to form a plurality of memory cell blocks. For example, two adjacent word line cutting structures WLC may define (e.g., delineate) one memory cell block between them. A plurality of channel structures CH may be placed inside each memory cell block defined by the word line cutting structure WLC.

In some embodiments, the word line cutting structure WLC may include an insulating material. For example, the insulating material may fill the word line cutting structure WLC. The insulating material may include, for example, but may not be limited to, at least one of silicon oxide (SiO), silicon nitride (SiN), and silicon oxynitride ($SiO_xN_y$).

The first interlayer insulating film 520 may be placed on the mold structure MS. The first interlayer insulating film 520 may at least partially cover the mold structure MS and the plurality of channel structures CH. The first interlayer insulating film 520 may include an oxide-based insulating material. The first interlayer insulating film 520 may include, for example, but may not be limited to, at least one of silicon oxide (SiO), silicon oxynitride ($SiO_xN_y$), and/or a low dielectric constant (low-k) material having a lower dielectric constant than silicon oxide (SiO).

In some embodiments, a bit line BL may be placed on the mold structure MS. The bit line BL may be the bit line (BL of FIG. 32) of the semiconductor device. The bit line BL may extend in the y-direction Y. The bit line BL may be connected to a plurality of channel structures CH. A bit line contact plug BLPG that may be connected to each channel structure CH may be formed in the first interlayer insulating film 520. The bit line contact plug BLPG may be connected to the channel pad 536. The bit line BL may include a conductive material. For example, the bit line BL may include, but may not be limited to, tungsten (W) and/or copper (Cu).

A second interlayer insulating film 585 may be placed on the bit line BL. The second interlayer insulating film 585 may be formed of silicon oxide (SiO). A first bonding layer 590 may be placed on the second interlayer insulating film 585. The first bonding layer 590 may be formed, for example, of silicon carbonitride (SiCN).

The first bonding pattern 595 may be placed in the second interlayer insulating film 585. The first bonding pattern 595 may include a first bonding barrier film 595BL and a first bonding filling film 595FL. The first bonding pattern 595 may contain manganese (Mn). The concentration of manganese (Mn) in the first bonding pattern 595 may gradually increase, with respect to a distance away from the bit line BL.

In some embodiments, the first bonding pattern 595 may be substantially similar and/or the same as the upper pad pattern PP_U described with reference to FIGS. 1 to 12. A cell bonding contact 580 may be provided between the first bonding pattern 595 and the bit line BL.

A peripheral circuit board 600 may be placed on the bit line BL. The peripheral circuit board 600 may include, for example, a semiconductor substrate such as a silicon (Si) substrate, a germanium (Ge) substrate, and/or a silicon-germanium (Si—Ge) substrate. Alternatively or additionally, the peripheral circuit board 600 may include a silicon-on-insulator (an) substrate, a germanium-on-insulator (GOI) substrate, or the like.

The peripheral circuit element PT may be formed on the peripheral circuit board 600. The peripheral circuit element PT may constitute a peripheral circuit that may control the operation of the semiconductor device. For example, the peripheral circuit element PT may include a control logic, a row decoder, a page buffer, and the like. As used herein, a surface of the peripheral circuit board 600 on which the peripheral circuit elements PT may be placed may be referred to as a front side of the peripheral circuit board 600. Alternatively or additionally, a surface of the peripheral circuit board 600 that may be opposite to the front side of the peripheral circuit board 600 may be referred to as a back side of the peripheral circuit board 600. In some embodiments, the front side of the peripheral circuit board 600 may face the front side of the cell substrate 500.

The peripheral circuit element PT may include, for example, but may not be limited to, a transistor. For example, the peripheral circuit element PT may include various active elements (e.g., a transistor, and the like) and/or various passive elements (e.g., a capacitor, a resistor, an inductor, and the like).

The peripheral circuit elements PT may be separated by the peripheral element isolation film 605. For example, the peripheral element isolation film 605 may be provided inside the peripheral circuit board 600. The peripheral element isolation film 605 may be a shallow trench isolation (STI) film. The peripheral element isolation film 605 may define (e.g., delineate) an active region of the peripheral circuit elements PT. The peripheral element isolation film 605 may include an insulating material. The peripheral element isolation film 605 may include, for example, at least one of silicon nitride (SiN), silicon oxide (SiO), and silicon oxynitride ($SiO_xN_y$).

The semiconductor device may further include a plurality of peripheral wiring patterns (e.g., first wiring patterns 632 and second wiring patterns 633), a plurality of peripheral wiring contacts 631, and a third interlayer insulating film 620. The plurality of peripheral wiring patterns 632 and 633 and the plurality of peripheral wiring contacts 631 may be electrically connected to each other. Each of the plurality of peripheral wiring patterns 632 and 633 and the plurality of peripheral wiring contacts 631 may include a conductive material. For example, each of the plurality of peripheral wiring patterns 632 and 633 and the plurality of peripheral wiring contacts 631 may include, but may not be limited to, tungsten (W) or copper (Cu).

A second bonding film 690 may be placed on the second interlayer insulating film 585. The second bonding film 690 may be formed of, for example, silicon carbonitride (SiCN).

A second bonding pattern 695 may be placed in the third interlayer insulating film 620. The second bonding pattern 695 may include a second bonding barrier film 695BL and a second bonding filling film 695FL. The second bonding pattern 695 may contain manganese (Mn). The concentration of manganese (Mn) in the second bonding pattern 695 may gradually increase, as a distance from the peripheral circuit element PT increases.

In some embodiments, the second bonding pattern 695 may be substantially similar and/or the same as the lower pad pattern PP_L discussed with reference to FIGS. 1 to 12. A peripheral bonding contact 680 may be provided between the second bonding pattern 695 and the wiring pattern 633.

In some embodiments, the first bonding pattern 595 and the second bonding pattern 695 may be bonded together to manufacture a semiconductor device. As described above, according to some embodiments, because the bonding energy between the first bonding pattern 595 and the second bonding pattern 695 is relatively high, the upper chip and the lower chip may be stably bonded.

Additionally, according to some embodiments of the present disclosure, even when the first bonding pattern 595 and the second bonding pattern 695 are misaligned with each other, the first bonding pattern 595 and the second bonding pattern 695 may be relatively more stably bonded with each other. Accordingly, a semiconductor device having improved reliability may be manufactured, when compared to related semiconductor devices.

While this invention has been described with reference to illustrative embodiments, this description is not intended to be construed in a limiting sense. Various modifications and combinations of the illustrative embodiments, as well as other embodiments of the invention, may be apparent to persons skilled in the art upon reference to the description. It is therefore intended that the appended claims encompass any such modifications or embodiments.

What is claimed is:

1. A semiconductor device manufacturing method, comprising:
- forming a lower chip and an upper chip; and
- bonding the lower chip and the upper chip to each other;
- wherein the forming of the lower chip comprises:
  - providing a lower substrate;
  - sequentially forming, on the lower substrate, a lower interlayer insulating film and a pre-lower adhesive film;
  - etching a first portion of the pre-lower adhesive film and a second portion of the lower interlayer insulating film to form a lower trench;
  - forming, using a sputtering process, a first lower seed film in the lower trench; and
  - forming, using the sputtering process, a second lower seed film on the first lower seed film,
- wherein the forming of the upper chip comprises:
  - providing an upper substrate;
  - sequentially forming, on the upper substrate, an upper interlayer insulating film and a pre-upper adhesive film;
  - etching a third portion of the pre-upper adhesive film and a fourth portion of the upper interlayer insulating film to form an upper trench;
  - forming, using the sputtering process, a first upper seed film in the upper trench; and
  - forming, using the sputtering process, a second upper seed film on the first upper seed film, and
  - wherein the second lower seed film and the second upper seed film comprise manganese (Mn).

2. The semiconductor device manufacturing method of claim 1, wherein the forming of the lower chip further comprises etching the first lower seed film and the second lower seed film to form a lower pad pattern, and wherein the forming of the upper chip further comprises etching the first upper seed film and the second upper seed film to form an upper pad pattern.

3. The semiconductor device manufacturing method of claim 2, wherein the bonding of the lower chip and the upper chip comprises bonding the lower pad pattern and the upper pad pattern to each other.

4. The semiconductor device manufacturing method of claim 2, wherein the forming of the lower pad pattern comprises forming the lower pad pattern to comprise a fifth portion and a sixth portion on the fifth portion, the sixth portion being in contact with the upper pad pattern, and wherein a first concentration of manganese (Mn) of the fifth portion is lower than a second concentration of manganese (Mn) of the sixth portion.

5. The semiconductor device manufacturing method of claim 2, wherein the forming of the lower pad pattern comprises etching the pre-lower adhesive film to form a lower adhesive film, a first upper face of the lower adhesive film being coplanar with a second upper face of the lower pad pattern, and at least a portion of the lower adhesive film being in contact with the upper pad pattern.

6. The semiconductor device manufacturing method of claim 5, further comprising disposing manganese (Mn) at a boundary between the lower adhesive film and the upper pad pattern.

7. The semiconductor device manufacturing method of claim 1, wherein the forming of the lower chip comprises forming a pre-lower barrier film along one or more side walls and a bottom face of the lower trench, before the forming of the first lower seed film.

8. The semiconductor device manufacturing method of claim 1, wherein the forming of the lower chip comprises performing a heat treatment process after forming the second lower seed film, and wherein the performing of the heat treatment process comprises performing the heat treatment process at a first temperature less than 200° C.

9. The semiconductor device manufacturing method of claim 8, wherein the performing of the heat treatment process comprises performing the heat treatment process at a second temperature higher than 100° C.

10. A semiconductor device manufacturing method, comprising:

forming a lower pad pattern and an upper pad pattern; and bonding the lower pad pattern and the upper pad pattern to each other, wherein the forming of the lower pad pattern comprises:

providing a lower interlayer insulating film;

etching a first portion of the lower interlayer insulating film to form a lower trench;

forming, using a sputtering process, a first lower seed film in the lower trench; and forming, using the sputtering process, a second lower seed film on the first lower seed film, wherein the forming of the upper pad pattern comprises:

providing an upper interlayer insulating film;

etching a second portion of the upper interlayer insulating film to form an upper trench;

forming a pre-upper barrier film in the upper trench along one or more side walls and a bottom face of the upper trench;

forming, using the sputtering process, a first upper seed film on the pre-upper barrier film;

forming a pre-upper filling film on the first upper seed film;

etching a third portion of the pre-upper filling film to form a recess; and forming, using the sputtering process, a second upper seed film in the recess, and wherein the second lower seed film and the second upper seed film comprise manganese (Mn).

11. The semiconductor device manufacturing method of claim 10, wherein a first thickness of the lower pad pattern in a vertical direction is less than a second thickness of the upper pad pattern in the vertical direction.

12. The semiconductor device manufacturing method of claim 11, wherein the forming of the lower pad pattern further comprises performing a heat treatment process after the forming of the second lower seed film, and wherein the performing of the heat treatment process comprises performing the heat treatment process at a temperature less than 200° C.

13. The semiconductor device manufacturing method of claim 10, wherein the forming of the lower pad pattern further comprises forming the lower pad pattern to comprise a fourth portion and a fifth portion on the first portion, the fifth portion being in contact with the upper pad pattern, and wherein a first concentration of manganese (Mn) of the fourth portion is less than a second concentration of manganese (Mn) of the fifth portion.

14. The semiconductor device manufacturing method of claim 10, wherein the forming of the lower pad pattern further comprises forming a lower adhesive film on the lower interlayer insulating film, wherein the forming of the upper pad pattern further comprises forming an upper adhesive film on the upper interlayer insulating film, wherein the bonding of the lower pad pattern and the upper pad pattern comprises bonding the lower adhesive film and the upper adhesive film, and wherein a first upper face of the lower adhesive film is coplanar with a second upper face of the lower pad pattern.

15. The semiconductor device manufacturing method of claim 14, wherein at least a portion of the lower adhesive film is in contact with the upper pad pattern, and wherein the semiconductor device manufacturing method further comprises disposing manganese (Mn) at a boundary between the lower adhesive film and the upper pad pattern.

16. The semiconductor device manufacturing method of claim 14, wherein at least a portion of the upper adhesive film is in contact with the lower pad pattern, and wherein the semiconductor device manufacturing method further comprises disposing manganese (Mn) at a boundary between the upper adhesive film and the lower pad pattern.

17. The semiconductor device manufacturing method of claim 10, wherein the forming of the pre-upper filling film comprises forming the pre-upper filling film using an electroplating process.

* * * * *